(12) United States Patent
Mirhaj et al.

(10) Patent No.: US 11,770,129 B2
(45) Date of Patent: Sep. 26, 2023

(54) PIPELINED ANALOG-TO-DIGITAL CONVERSION

(71) Applicant: Qualcomm Incorporated, San Diego, CA (US)

(72) Inventors: Seyed Arash Mirhaj, Poway, CA (US); Lei Sun, San Diego, CA (US); Yuhua Guo, San Diego, CA (US); Elias Dagher, Laguna Niguel, CA (US); Aram Akhavan, San Diego, CA (US); Yan Wang, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/484,581

(22) Filed: Sep. 24, 2021

(65) Prior Publication Data

US 2023/0100825 A1 Mar. 30, 2023

(51) Int. Cl.
*H03M 1/06* (2006.01)
*H03M 1/16* (2006.01)
*H03M 1/38* (2006.01)
*H04B 1/40* (2015.01)

(52) U.S. Cl.
CPC ............. *H03M 1/167* (2013.01); *H03M 1/38* (2013.01); *H04B 1/40* (2013.01)

(58) Field of Classification Search
CPC .................................. H03M 1/167; H03M 1/38
USPC ................. 341/144, 155, 120, 118, 135, 161
See application file for complete search history.

(56) References Cited

U.S. PATENT DOCUMENTS

| | | | |
|---|---|---|---|
| 9,912,344 B1 | 3/2018 | Waltari | |
| 2010/0321227 A1* | 12/2010 | Hales | H03M 1/146 341/158 |
| 2016/0352349 A1* | 12/2016 | Yoshioka | H03M 1/124 |

OTHER PUBLICATIONS

International Search Report and Written Opinion—PCT/US2022/075353—ISA/EPO—dated Dec. 23, 2022, 13 pages.
Oh T., et al., "A Time-Based Pipelined ADC using both Voltage and Time Domain Information", IEEE Journal of Solid-State Circuits, IEEE, USA, vol. 49, No. 4, Apr. 2014, pp. 961-971, XP011544012, figures 2,4,9,12.

* cited by examiner

*Primary Examiner* — Peguy Jean Pierre
(74) *Attorney, Agent, or Firm* — Colby Nipper QUALCOMM Incorporated

(57) ABSTRACT

An apparatus is disclosed for pipelined analog-to-digital conversion. In an example aspect, the apparatus includes a pipelined analog-to-digital converter (ADC). The pipelined ADC includes a first stage and a second stage. The first stage includes a sampler and a quantizer coupled to the sampler. The first stage also includes a current distribution circuit coupled to the sampler. The second stage includes a sampler coupled to the current distribution circuit and a quantizer coupled to the sampler of the second stage.

30 Claims, 13 Drawing Sheets

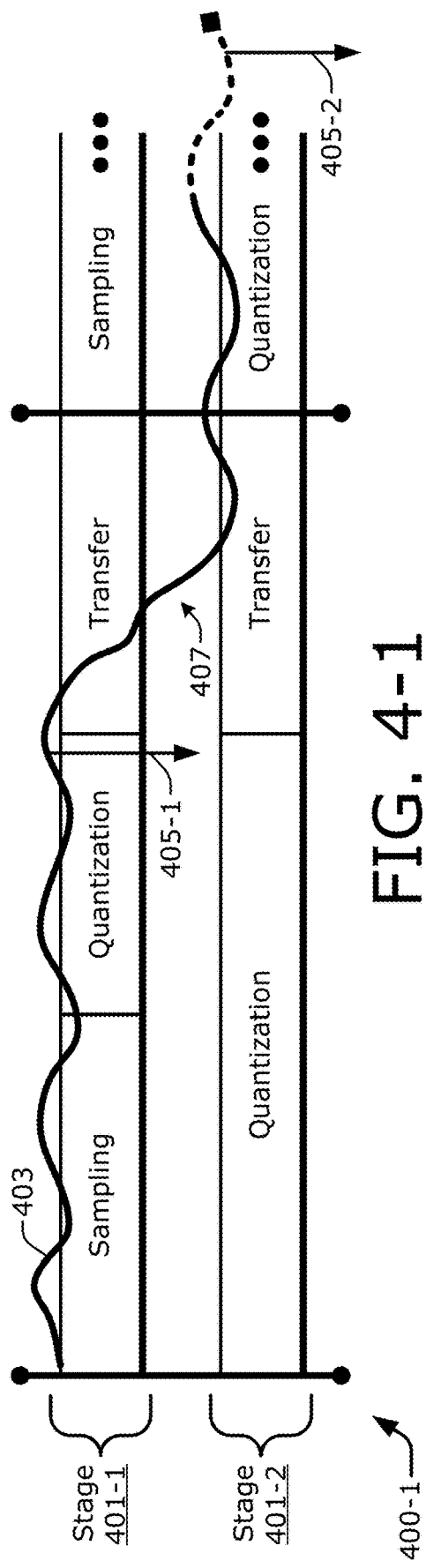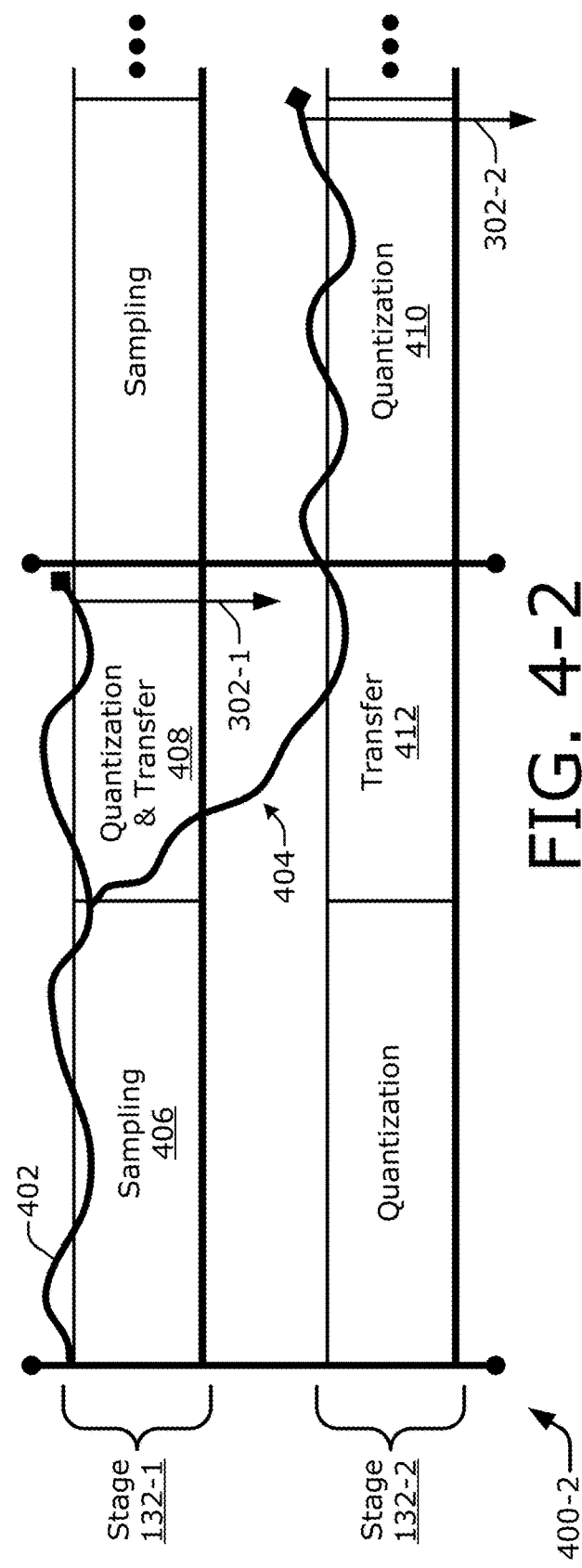
FIG. 4-1
FIG. 4-2

US 11,770,129 B2

PIPELINED ANALOG-TO-DIGITAL CONVERSION

TECHNICAL FIELD

This disclosure relates generally to signal communication or signal processing using an electronic device and, more specifically, to pipelined analog-to-digital conversion.

BACKGROUND

Electronic devices include traditional computing devices such as desktop computers, notebook computers, smartphones, wearable devices like smartwatches, and internet servers. However, electronic devices also include other types of computing devices, such as personal voice assistants (e.g., smart speakers), wireless access points or routers, thermostats or other automated controllers, robotics, automotive electronics, devices embedded in other machines like refrigerators and industrial tools, and Internet of Things (IoT) devices. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between two or more electronic devices using wireless or wired signals that are transmitted over one or more networks, such as the Internet, a Wi-Fi® network, or a cellular network. Electronic communications can therefore include both wireless and wired transmissions and receptions. To make such electronic communications, an electronic device can use a transceiver, such as a wireless transceiver for wireless communications.

Wireless electronic communications can be realized by propagating signals between two wireless transceivers at two different electronic devices. For example, using a wireless transmitter, a smartphone can transmit a wireless signal to a base station of a cellular network over the air as part of an uplink communication to support mobile services. Using a wireless receiver, the smartphone can receive a wireless signal that is transmitted from the base station as part of a downlink communication to enable mobile services. With a smartphone, mobile services can include making audio and video calls, participating in social media interactions, sending messages, watching movies, sharing videos, performing searches, acquiring map information or navigational instructions, finding friends, engaging in location-based services generally, transferring money, and obtaining another service like a car ride. Other services and devices that can be enhanced with wireless communications include self-driving vehicles, augmented reality (AR) and other mixed reality (MR) imaging, on-the-go 4K video streaming, ubiquitous sensors to keep people safe and to use natural resources more efficiently, real-time language translations, and so forth.

Many of these mobile services depend at least partly on the transmission and reception of wireless signals between two or more electronic devices. Consequently, electrical engineers and other designers of wireless devices strive to develop wireless communication hardware and associated technologies that enable wireless signals to be used effectively to provide these and other mobile services.

SUMMARY

A wireless transceiver, along with other components of an electronic device, can include an analog-to-digital converter (ADC). A pipelined ADC is a type of ADC in which an analog signal is converted over multiple pipeline stages into a set of output bits that represent the analog signal as a digital signal. In one approach to a pipelined ADC, a stage samples an analog signal, converts the sampled analog signal into a portion of the set of output bits, and then transfers analog information to a succeeding stage for conversion into another portion of the output bits. This approach performs these three operations sequentially across three phrases. To produce the set of output bits more quickly, this document describes an approach in which the conversion operation and the transfer operation are at least partially overlapped and can therefore be condensed into substantially one phase. In example implementations of this latter approach, a current distribution circuit of a first stage of a pipelined ADC supports the conversion of an analog signal at the first stage into a portion of the set of output bits while causing analog information related to a sample of the analog signal to be transferred to a second stage. For instance, at least one current source can reduce a voltage on a sampling capacitor of the first stage while increasing a voltage on a sampling capacitor of the second stage. In these manners, a pipelined ADC can more quickly produce a digital signal based on an analog signal to provide a faster conversion response and/or to convert higher frequency signals.

In an example aspect, an apparatus for pipelined analog-to-digital conversion is disclosed. The apparatus includes a pipelined analog-to-digital converter. The pipelined analog-to-digital converter includes a first stage and a second stage. The first stage includes a sampler, a quantizer coupled to the sampler, and a current distribution circuit coupled to the sampler. The second stage includes a sampler coupled to the current distribution circuit and a quantizer coupled to the sampler of the second stage.

In an example aspect, an apparatus for pipelined analog-to-digital conversion is disclosed. The apparatus includes a first stage and a second stage. The first stage includes a sampler configured to obtain a sample of an analog signal and a quantizer coupled to the sampler. The second stage includes a sampler and a quantizer coupled to the sampler of the second stage. The apparatus also includes means for distributing current to the sampler of the first stage and the sampler of the second stage based on the sample.

In an example aspect, a method for pipelined analog-to-digital conversion and/or a method for operating a pipelined analog-to-digital converter is disclosed. The method includes sampling an analog signal to obtain an analog voltage on at least one capacitor of a first stage of the pipelined analog-to-digital converter. The method also includes comparing the analog voltage to another voltage to produce a comparison signal. The method additionally includes quantizing the analog voltage to produce a digital value for the first stage based on the comparison signal. The method further includes transferring an indication of the analog voltage to a second stage of the pipelined analog-to-digital converter based on the comparison signal at least partially during the quantizing of the analog voltage.

In an example aspect, an apparatus for pipelined analog-to-digital conversion is disclosed. The apparatus includes a pipelined analog-to-digital converter. The pipelined analogto-digital converter includes a first stage and a second stage. The first stage includes a sampler configured to obtain a sample of an analog signal and a time-to-digital converter. The first stage also includes a comparator having an input and an output. The input is coupled to the sampler, and the output is coupled to the time-to-digital converter and the sampler. The second stage includes a sampler coupled to the output of the comparator and to the time-to-digital converter.

BRIEF DESCRIPTION OF DRAWINGS

FIG. 4-1 illustrates two stages of a pipelined ADC in which a first stage uses three phases to perform sampling, quantization, and analog transfer operations.

FIG. 4-2 illustrates two stages of a pipelined ADC in which an example first stage uses two phases to perform sampling, quantization, and analog transfer operations by at least partially overlapping the quantization and the analog transfer operations, thereby accelerating the conversion of an analog signal into a set of output bits for a digital signal.

FIG. 9-1 is a circuit diagram illustrating an example pipelined ADC in which a same current can be routed to respective samplers of first and second stages of the pipelined ADC and in which a magnitude of the current can be adjusted over time.

FIG. 9-2 includes a graph illustrating example circuit values for the circuit diagram of FIG. 9-1.

FIG. 10-1 is a circuit diagram illustrating an example pipelined ADC in which respective currents can be routed to respective samplers of first and second stages of the pipelined ADC using at least one current mirror.

FIG. 10-2 includes graphs illustrating example circuit values for the circuit diagram of FIG. 10-1.

DETAILED DESCRIPTION

Figure 1:
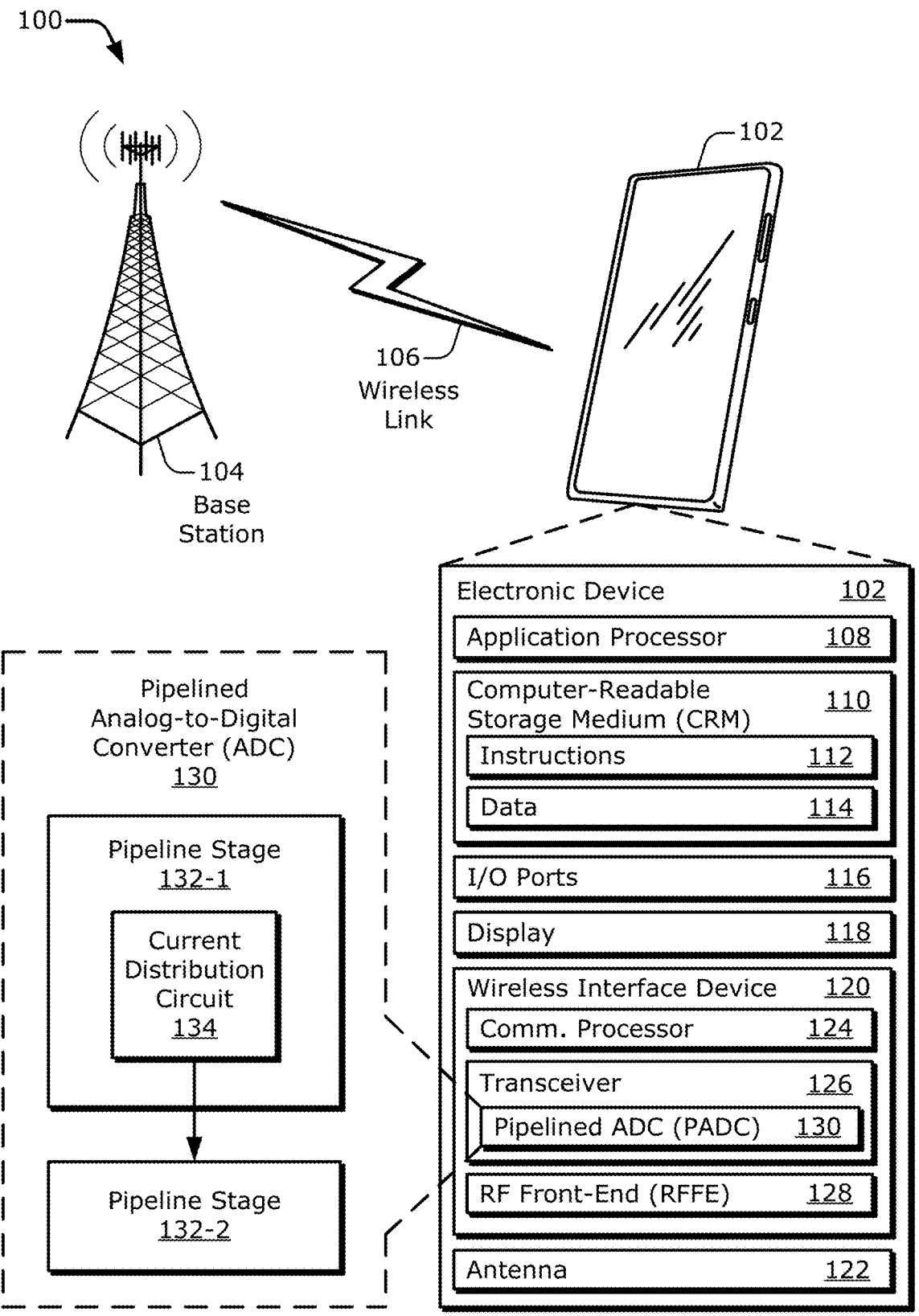
FIG. 1 is a schematic diagram illustrating an environment with an example electronic device having a wireless interface device that includes a transceiver having a pipelined analog-to-digital converter (ADC).

To facilitate transmission and reception of wireless signals, an electronic device can use a wireless interface device that includes a wireless transceiver. The wireless transceiver includes several components to generate, manipulate, condition, or otherwise process signals for transmission or reception. For example, an analog-to-digital converter (ADC) can convert a received signal in analog form into a digital signal that can be processed to recover information carried on the received signal. A pipelined ADC is a type of ADC that can be designed to be faster than some other types of ADCs. A pipelined ADC (or pipeline ADC) operates by separating the process for analog-to-digital conversion into multiple portions using multiple stages. Each stage forms an analog-to-digital conversion stage (ADC stage) of the pipelined ADC.

Thus, a pipelined analog-to-digital converter (or pipeline analog-to-digital converter) has multiple ADC stages. Each ADC stage is responsible for producing a portion of an output digital signal. For instance, if an eight-bit digital signal is being output, a two-stage pipelined ADC may include one stage that produces four bits of the digital signal and another stage that produces another four bits. An eight-bit digital output signal is, however, only an example, for a pipelined ADC may output a digital signal with a different quantity of bits. A pipelined ADC can perform a conversion operation faster than some other ADC types by distributing the conversion process across multiple stages to produce the output digital signal from an analog signal. In other words, multiple stages of a pipelined ADC can operate simultaneously.

Although each stage of a pipelined ADC may be operating simultaneously, the multiple stages are each respectively converting a different analog signal—or, more precisely, a different sample of an analog signal obtained at a respective different time—into digital bits at any given single moment. To provide a clarifying example: while a second stage is converting an "earlier" analog signal (e.g., a sample of an analog signal that is obtained at an earlier time) to a second four-bit portion of an eight-bit digital number, a first stage is converting a "subsequent" sample of the analog signal to a first four-bit portion of a different eight-bit digital number representing a different time. In some cases, the first four-bit portion corresponds to the most-significant bits of the digital number, and the second four-bit portion corresponds to the least-significant bits of the digital number. Generally, the second stage can start producing the second four-bit portion of a digital number for a particular analog signal sample after the first stage is finished converting the first four-bit portion of the digital number for that analog signal sample. To enable the second stage to begin producing the second four-bit portion of the digital number, the first stage transfers an indication of that analog signal sample to the second stage.

In one approach to pipelined ADCs, a first stage transfers an indication of a sample of an analog signal to a second stage only after the first stage has completed converting the sample to a first portion of a digital number for the digital signal version of the analog signal. With this approach, the first stage can include three phases: a sampling phase, a quantization phase, and a transfer phase. In the sampling phase, the first stage obtains a sample, or initial indication, of the analog signal. In the quantization phase, the first stage determines a portion of the multiple bits for the output digital signal based on the sample of the analog signal. After the quantization phase, as part of the transfer phase, the first stage transfers an indication of the analog signal to the second stage so that the second stage can begin converting the sample of the analog signal. In other words, with this pipelined ADC approach, the transfer of analog information from the first stage to the second stage is not started until the first stage completes its portion of the overall conversion process. This sequential approach to quantization and transfer delays when the second stage can start converting the sample of the analog signal, which slows or lengthens the overall ADC process of the pipelined ADC.

In another approach to pipelined ADCs as set forth in this document, at least parts of two of the phases that are described above can be combined into one phase. In this approach, a pipelined ADC has at least two stages: a first stage and a second stage. The first stage operates on a given analog signal sample prior to when the second stage operates on the given analog signal sample (e.g., while the second stage may be operating on a previous analog signal sample). The first stage can have two phases: a sampling phase and a combined quantization and transfer phase. By combining the quantization and transfer operations, the first stage can provide an indication of the analog signal sample to the second stage faster as compared to having serialized quantization and transfer phases.

Accordingly, the second stage can receive the analog information earlier with the combined quantization-and-transfer-phase approach. This enables the second stage to start converting the analog signal sooner, which shortens the overall time the pipelined ADC consumes to fully convert an analog signal sample. Because the pipelined ADC is providing a converted output digital signal faster, downstream circuitry can process the digital signal sooner and improve communication and/or computing performance by shortening response times. Moreover, the pipelined ADC can operate at higher frequencies. A pipelined ADC that functions as described herein can reach, for example, approximately a 500-megahertz (MHz) to 1-gigahertz (GHz) bandwidth. With this bandwidth, a pipelined ADC can support Sub-6 GHz devices and millimeter wave (mmW) communications (e.g., for a $5^{th}$ Generation (5G) cellular standard). A pipelined ADC can be deployed, for instance, to convert an analog signal to a digital signal as part of an intermediate frequency (IF) portion of a mmW transceiver.

In example implementations, a pipelined ADC includes a first stage and a second stage. The first stage includes a current distribution circuit that can provide a current to the second stage, with the current carrying analog information indicative of a sample of the analog signal being converted by the pipelined ADC. The current distribution circuit can provide the current to the second stage while the first stage is quantizing the sample of the analog signal. More specifically, the first stage can include a sampler, a comparator, and a quantizer, in addition to the current distribution circuit. The second stage can include a sampler, a comparator, and a quantizer. The current distribution circuit can be coupled to the sampler of the first stage and the sampler of the second stage. A residue determiner can be part of the first stage, part of the second stage, or separate from both.

In example operations, the current distribution circuit provides at least one current to the sampler of the first stage and the sampler of the second stage. This at least one current can discharge, or drain a charge stored on, the sampler of the first stage and charge the sampler of the second stage. During this time, the comparator of the first stage can monitor the sampler thereof. While charge remains on the sampler of the first stage, the comparator can cause the current distribution circuit to provide the at least one current. The comparator can also cause the quantizer of the first stage to be operating to determine a digital value for the first stage. The digital value of the first stage and a digital value from the second stage can be used to produce for the pipelined ADC a digital output signal that represents the sample of the analog signal.

Accordingly, the first stage is performing quantization and at least beginning to transfer analog information to the sampler of the second stage during the quantization operation. Upon completion of the quantization, the first stage may apply the determined digital value to the residue determiner to generate an analog residue signal for the sampler of the second stage. Thus, at least a portion of the transfer of the analog signal occurs while the first stage is quantizing the sample of the analog signal. This approach can reduce the length of time—e.g., the delay—before the second stage can begin converting the sample of the analog signal. Reducing this delay accelerates the conversion process of the overall pipelined ADC and can enable the pipelined ADC to operate at higher bandwidths. The higher bandwidths facilitate communicating at higher frequencies to provide faster, more dynamic, and newer mobile services.

In some implementations, the current distribution circuit is realized with at least one current source. The comparator of the first stage can control whether the at least one current source is applying at least one current. In one scheme, the at least one current source can apply a same current to the sampler of the first stage and the sampler of the second stage. The current coupled to the samplers may be constant during the quantization and transfer phase or may be reduced (e.g., by switching from one current source to another) as a capacitor of the sampler of the first stage becomes closer to being drained to reduce "overshooting" of the analog voltage at the sampler of the second stage and/or to manage impedance changes across the current source(s). In an alternative scheme, the at least one current source can apply a first current to the sampler of the first stage and a second current to the sampler of the second stage using a current mirror. With the current mirror scheme, the applied first and second currents may have different magnitudes from each other using current scaling.

In some cases, the quantizer of the first stage can be realized using a time-to-digital converter (TDC), and the quantizer of the second stage can be realized using a successive approximation register (SAR). In such cases, the temporal information derived from the TDC can be leveraged to transfer analog information from the first stage to the second stage in conjunction with the analog sample being converted into bits for the digital value of the first stage. To produce an analog residue voltage for the second stage, the TDC can "iteratively" apply the digital value of the first stage to the residue determiner as bits of the digital value are ascertained or can "abruptly" apply the bits of the digital value together once the complete digital value is ascertained.

This document describes some ADC implementations in the context of a wireless interface device, such as a wireless transceiver and/or a receive chain thereof. Described ADC implementations may, however, be deployed in different environments or employed in alternative applications. For example, a pipelined ADC, which includes a pipeline stage having a phase with overlapping quantization and transfer operations, can be used in a wired communication component, a processor, a system-on-chip (SoC), a camera sensor, or an integrated circuit (IC) generally.

FIG. 1 is a schematic diagram illustrating an example environment 100 including an electronic device 102 that has a wireless interface device 120. The wireless interface device 120 includes a transceiver 126 having a pipelined analog-to-digital converter 130 (pipelined ADC 130). This document describes example implementations of the pipelined ADC 130, which can include a stage that functions with at least overlapping operations or with an operation-combining phase. In the environment 100, the example electronic device 102 communicates with a base station 104 through a wireless link 106.

In FIG. 1, the electronic device 102 is depicted as a smartphone. The electronic device 102, however, may be implemented as any suitable computing or other electronic device. Examples of an apparatus comprising an electronic device 102 include a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), and medical device.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line interface, or another electronic device as described above generally. As shown, the wireless link 106 can extend between the electronic device 102 and the base station 104.

The wireless link 106 can include a downlink of data or control information communicated from the base station 104 to the electronic device 102. The wireless link 106 can also include an uplink of other data or control information communicated from the electronic device 102 to the base station 104. The wireless link 106 may be implemented using any suitable wireless communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi® 6 or WiGig®); an IEEE 802.16 standard (e.g., WiMAX®); and a Bluetooth® standard. In some implementations, the wireless link 106 may provide power wirelessly, and the electronic device 102 or the base station 104 may comprise a power source.

As shown for some implementations, the electronic device 102 can include at least one application processor 108 and at least one computer-readable storage medium 110 (CRM 110). The application processor 108 may include any type of processor that is configured to execute processor-executable instructions (e.g., code) stored by the CRM 110. Examples of the application processor 108 include a central processing unit (CPU), a multicore processor, a graphics processor, a neural network accelerator, and so forth. The CRM 110 may include any suitable type of data storage media, such as volatile memory (e.g., random-access memory (RAM)), non-volatile memory (e.g., Flash memory), optical media, and magnetic media (e.g., disk or tape). In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and cameras or other sensor ports. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 can further include at least one wireless interface device 120 and at least one antenna 122. The example wireless interface device 120 provides connectivity to respective networks and peer devices via a wireless link, which may be configured similar to or differently from the wireless link 106. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like.

As shown, the wireless interface device 120 can include at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or another processor can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals received via the at least one antenna 122 using components of the wireless interface device 120.

Further, the application processor 108 or the communication processor 124, including a combination thereof, can be realized using digital circuitry that implements logic or functionality that is described herein. Additionally, the communication processor 124 may also include a memory (not separately depicted) to store data and processor-executable instructions (e.g., code), such as a CRM 110.

As shown, the transceiver 126 can include at least one ADC, such as the pipelined ADC 130, which is described below. The transceiver 126 can also include circuitry and logic for filtering, switching, amplification, channelization, or frequency translation. Frequency translation functionality may include an up-conversion or a down-conversion of frequency that is performed through a single conversion operation (e.g., with a direct-conversion architecture) or through multiple conversion operations (e.g., with a super-heterodyne architecture). Generally, the transceiver 126 can include filters, switches, amplifiers, or mixers for routing and conditioning signals that are transmitted or received via the antenna 122.

In addition to an ADC such as the pipelined ADC 130, the transceiver 126 can include a digital-to-analog converter (DAC). In operation, an ADC can convert analog signals to digital signals, and a DAC can convert digital signals to analog signals. Generally, an ADC or a DAC can be implemented as part of the communication processor 124, as part of the transceiver 126, or separately from both (e.g., as another part of an SoC, as part of the application processor 108, or as part of a sensor).

Figure 2:
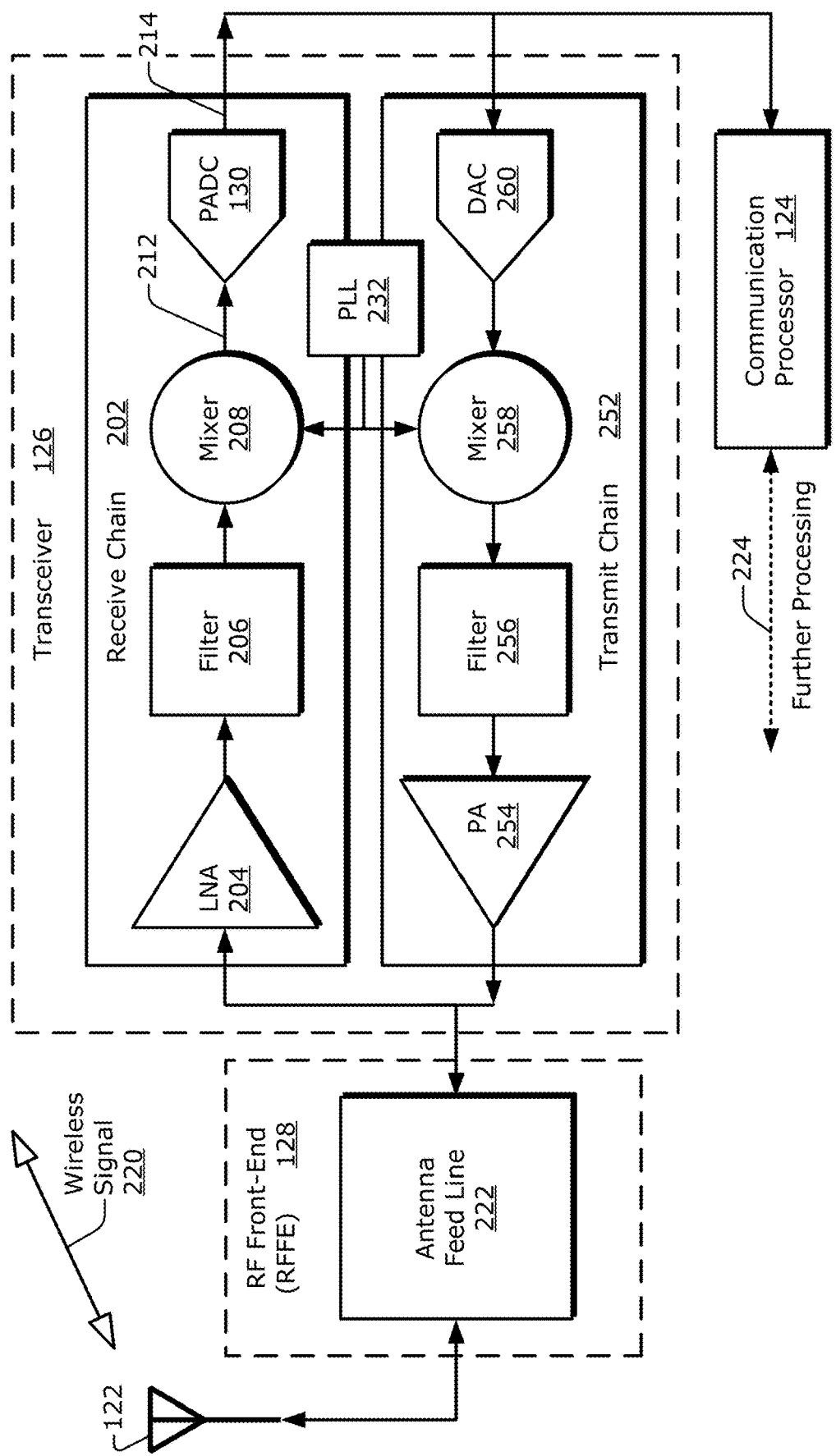
FIG. 2 is a schematic diagram illustrating an example transceiver including a pipelined ADC that is part of a receive chain.

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

The RF front-end 128 can include one or more filters, switches, or amplifiers for conditioning signals received via the antenna 122 or for conditioning signals to be transmitted via the antenna 122. The RF front-end 128 may include a phase shifter (PS), peak detector, power meter, gain control block, antenna tuning circuit, N-plexer, balun, and the like. Configurable components of the RF front-end 128, such as a phase shifter or automatic gain controller (AGC), may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, the pipelined analog-to-digital converter 130 (pipelined ADC 130) is depicted as being part of a transceiver 126. Described implementations of a pipelined ADC 130 can, however, additionally or alternatively be employed in other portions of the wireless interface device 120, such as part of the communication processor 124 or the RF front-end 128. Further, a pipelined ADC 130 can be employed in other portions of the electronic device 102 generally, such as where an analog signal or analog sensor information is being digitized for storage or processing.

The pipelined ADC 130 can include multiple pipeline stages, including a first pipeline stage 132-1 (or first stage 132-1) and a second pipeline stage 132-2 (or second stage 132-2). In example implementations, the first stage 132-1 includes a current distribution circuit 134 that is coupled to the second stage 132-2. In operation, the current distribution circuit 134 can provide a current to the second stage 132-2. The current may carry analog information indicative of a sample of an analog signal that is being converted to a digital signal by the pipelined ADC 130. The current distribution circuit 134 can provide the current to the second stage 132-2 while the first stage 132-1 is quantizing the sample of the analog signal.

By at least partially overlapping a quantization operation and a transfer-of-analog-information operation (e.g., into a single phase) in the first stage 132-1, the second stage 132-2 can start converting a residue of the analog signal sooner as compared to performing these operations sequentially. A description of examples stages and associated operational phases is set forth below with reference to FIG. 4-2. Examples of first and second stages 132-1 and 132-2 for a pipelined ADC 130 are described below with reference to FIGS. 5, 6, and 7. A description of an example pipelined ADC 130 is provided below with reference to FIG. 3. Next, however, this document describes example transceiver implementations.

FIG. 2 illustrates, at 200 generally, an example transceiver 126 including a pipelined ADC 130 that is part of a receive chain 202. In addition to the transceiver 126, FIG. 2 depicts the antenna 122, the RF front-end 128, and the communication processor 124. The communication processor 124 can communicate one or more data signals to or from other components, such as the application processor 108 of FIG. 1, for further processing at 224 (e.g., for processing at an application level).

As illustrated from left to right, in example implementations, the antenna 122 is coupled to the RF front-end 128, and the RF front-end 128 is coupled to the transceiver 126. The transceiver 126 is coupled to the communication processor 124. The example RF front-end 128 includes at least one antenna feed line 222. The example transceiver 126 includes at least one receive chain 202 and at least one transmit chain 252. Although only one RF front-end 128, one transceiver 126, and one communication processor 124 are shown at 200, an electronic device 102, or a wireless interface device 120 thereof, can include multiple instances of any or all such components. Also, although only certain components are explicitly depicted in FIG. 2 and are shown coupled together in a particular manner, the transceiver 126 may include other non-illustrated components, more or fewer components, and differently coupled arrangements of components.

In some implementations, the RF front-end 128 couples the antenna 122 to the transceiver 126 via the antenna feed line 222. In operation, the antenna feed line 222 propagates a signal between the antenna 122 and the transceiver 126. During or as part of the signal propagation, the antenna feed line 222 conditions the propagating signal. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or an antenna feed line 222 thereof, may include one or more other components, such as a filter, an amplifier (e.g., a power amplifier or a low-noise amplifier), an N-plexer, or a phase shifter.

In some implementations, the transceiver 126 can include at least one receive chain 202, at least one transmit chain 252, or at least one receive chain 202 and at least one transmit chain 252. The receive chain 202 can include a low-noise amplifier 204 (LNA 204), a filter 206, a mixer 208 for frequency down-conversion, and a pipelined ADC 130 (PADC 130). The transmit chain 252 can include a power amplifier 254 (PA 254), a filter 256, a mixer 258 for frequency up-conversion, and a DAC 260. However, the receive chain 202 or the transmit chain 252 can include other components—for example, additional amplifiers or filters, multiple mixers, one or more buffers, or at least one local oscillator—that are electrically disposed anywhere along the depicted receive and transmit chains.

The receive chain 202 is coupled between the antenna feed line 222 of the RF front-end 128 and the communication processor 124—e.g., via the low-noise amplifier 204 and the PADC 130, respectively. The transmit chain 252 is coupled between the antenna feed line 222 and the communication processor 124—e.g., via the power amplifier 254 and the DAC 260, respectively. The transceiver 126 can also include at least one phase-locked loop 232 (PLL 232) that is coupled to a mixer 208 or 258—which phrase can entail including the mixer 208 and the mixer 258 in accordance with an optional but permitted inclusive-or interpretation of the word "or." For example, the transceiver 126 can include one PLL 232 for each transmit/receive chain pair, one PLL 232 per transmit chain and one PLL 232 per receive chain, or multiple PLLs 232 per chain.

As shown for certain example implementations of the receive chain 202, the antenna 122 is coupled to the low-noise amplifier 204 via the antenna feed line 222, and the low-noise amplifier 204 is coupled to the filter 206. The filter 206 is coupled to the mixer 208, and the mixer 208 is coupled to the pipelined ADC 130. The pipelined ADC 130 is in turn coupled to the communication processor 124. As shown for certain example implementations of the transmit chain 252, the communication processor 124 is coupled to the DAC 260, and the DAC 260 is coupled to the mixer 258. The mixer 258 is coupled to the filter 256, and the filter 256 is coupled to the power amplifier 254. The power amplifier 254 is coupled to the antenna 122 via the antenna feed line 222. Although only one receive chain 202 and one transmit chain 252 are explicitly shown, an electronic device 102, or a transceiver 126 thereof, can include multiple instances of either or both components. Although the pipelined ADC 130 and the DAC 260 are illustrated as being separately coupled to the processor 124, they may share a bus or other means for communicating with the processor 124.

As part of an example signal-receiving operation, the low-noise amplifier 204 provides an amplified signal to the filter 206. The filter 206 filters the amplified signal and provides a filtered signal to the mixer 208. The mixer 208 performs a frequency conversion operation on the filtered signal to down-convert from one frequency to a lower frequency (e.g., from a radio frequency (RF) to an intermediate frequency (IF) or to a baseband frequency (BBF)). The mixer 208 can perform the frequency down-conversion in a single conversion step or through multiple conversion steps using at least one PLL 232. The mixer 208 can provide a down-converted signal to the pipelined ADC 130 for conversion from an analog version of the signal to a digital version of the signal. The pipelined ADC 130 can forward the digital signal to the communication processor 124. Thus, for the examples of FIG. 2, the pipelined ADC 130 can operate at least on IF or BBF signals.

Generally, the pipelined ADC 130 accepts or otherwise receives an analog input signal 212 from another component, such as the mixer 208 or another filter. The pipelined ADC 130 performs an analog-to-digital conversion operation on the analog signal to produce a digital signal. To do so, the pipelined ADC 130 can quantize a sampled moment of the analog signal into a bin of multiple bins. The pipelined ADC 130 can further assign multiple bits corresponding to the bin to represent the sampled instance of the analog signal. Thus, the pipelined ADC 130 can produce a digital output signal 214, which may span at least one sampled instance of the analog input signal 212. The pipelined ADC 130 can provide or forward the digital output signal 214 to another component, such as the communication processor 124. Although the pipelined ADC 130 is shown as part of a receive chain 202 of a transceiver 126, a pipelined ADC 130 may be implemented in other components or portions of an electronic device.

Figure 3:
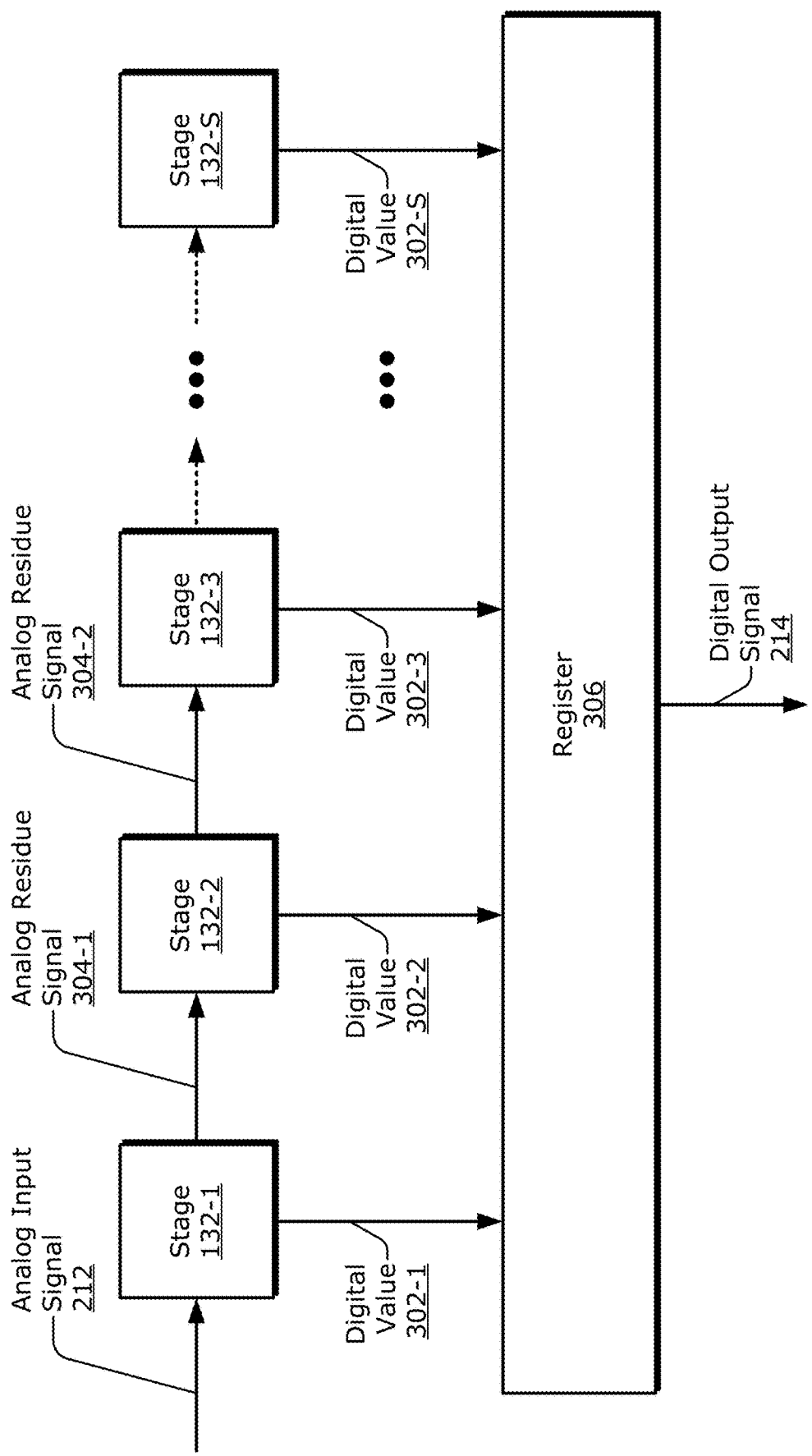
FIG. 3 is a schematic diagram illustrating an example pipelined ADC including multiple analog-to-digital conversion stages (ADC stages) and at least one register.

FIG. 3 is a schematic diagram illustrating an example pipelined ADC 130 including multiple analog-to-digital conversion stages (ADC stages) and at least one register 306. The pipelined ADC 130 accepts an analog input signal 212 and produces a digital output signal 214. To do so, the pipelined ADC 130 uses two or more ADC stages that can operate substantially in parallel but on different samples of the analog input signal 212 that are obtained at different times to generate digital values that form or can be used to produce the digital output signal 214.

In example implementations, the pipelined ADC 130 includes multiple stages 132-1, 132-2, 132-3, . . . , 132-S, with "S" representing an integer that is greater than one. The pipelined ADC 130 may also include multiple residue determiners, each of which may be realized at least partly using a summing component. Although not shown in FIG. 3, each residue determiner may be coupled between two consecutive ADC stages or may be part of at least one of two adjacent ADC stages. Examples of a residue determiner are described below with reference to FIG. 6. Each residue determiner can produce a residue signal, such as an analog residue signal or voltage. A residue amplifier (not shown) may be coupled between consecutive ADC stages, or otherwise after a residue determiner, to amplify a determined residue signal.

As illustrated, an output of a first stage 132-1 (or first ADC stage 132-1) is coupled to an input of a second stage 132-2 (or second ADC stage 132-2). Similarly, an output of the second stage 132-2 is coupled to an input of a third stage 132-3 (or third ADC stage 132-3). The pipelined ADC 130 also includes at least one register 306 that can be coupled to multiple pipelined stages, such as to each stage 132 of the multiple stages 132-1 to 132-S.

In example operations, a respective stage 132 of the multiple stages 132-1 to 132-S produces a respective digital value 302 of multiple digital values 302-1 to 302-S. For example, the first stage 132-1 can produce a first digital value 302-1, and the second stage 132-2 can produce a second digital value 302-2. The third stage 132-3 can produce a third digital value 302-3, and an "Sth" stage 132-S can produce an "Sth" digital value 302-S. Each respective stage 132 provides the respective digital value 302 to the register 306. The register 306 therefore accepts or otherwise receives the multiple digital values 302-1 to 302-S, with each respective digital value 302 of the multiple digital values 302-1 to 302-S accepted from a respective stage 132 of the multiple stages 132-1 to 132-S. The register 306 combines or otherwise encodes the multiple digital values 302-1 to 302-S to produce the digital output signal 214 for the pipelined ADC 130.

A given stage 132 produces a digital value 302 as an output signal thereof based on an input signal for the stage 132. In the case of the first stage 132-1 (as depicted in FIG. 3), the stage input signal can correspond to the analog input signal 212. For other ADC stages, the stage input signal can correspond to a respective analog residue signal 304 from a preceding stage. In addition to the digital value 302, a given stage 132 can generate an analog residue signal 304 as another output signal. In some implementations, a stage 132 provides the analog residue signal 304 to a residue amplifier (not shown). If present, the residue amplifier can amplify the analog residue signal 304 to produce a residue input signal for a next or succeeding stage 132.

In FIG. 3, the pipelined ADC 130 is depicted with a first analog residue signal 304-1 and a second analog residue signal 304-2. By way of example, the first stage 132-1 can generate the first analog residue signal 304-1 (e.g., if the first stage 132-1 includes a residue determiner) and can forward the first analog residue signal 304-1 to the second stage 132-2. The second stage 132-2 accepts or otherwise receives the first analog residue signal 304-1 and produces the second digital value 302-2 and the second analog residue signal 304-2 based on the first analog residue signal 304-1.

The pipelined operations can continue with additional ADC stages. In some cases, relatively more significant bits (e.g., most significant bits (MSBs)) are produced by a given ADC stage before relatively less significant bits (e.g., least significant bits (LSBs)) are produced by a downstream consecutive ADC stage for a given sample of the analog input signal 212. In such cases, the bits of the second digital value 302-2 may have less significance than the bits of the first digital value 302-1. Although four ADC stages are explicitly shown in FIG. 3, a pipelined ADC 130 may include two ADC stages (e.g., where "S" equals "2"), three ADC stages, or more than four ADC stages.

In some environments, one or more ADC stages may be designed with different types of ADC schemes or circuitries than other ADC stages. For instance, the pipeline stages before a "final" pipeline stage 132-S (where "S" is the last stage) may be different from the last stage 132-S. In an example pipelined ADC 130, a first stage 132-1 precedes a second stage 132-2. The architecture of the first stage 132-1 is different from that of the second stage 132-2. Here, the second stage 132-2 is a last or final stage. Thus, if a third stage 132-3 is added to the pipelined ADC 130, it can be added to precede the first stage 132-1 (although the reference numbering illustrated in FIG. 3 differs from that of this example). The architectures of the first and third stages 132-1 and 132-3 may be the same as each other and/or may be different from the architecture of the last stage, which is the second stage 132-2 in this instance. Examples of such different per-stage architectures are described herein.

FIG. 4-1 illustrates, at 400-1 generally, two stages 401-1 and 401-2 of a pipelined ADC in which a first stage 401-1 uses three phases to perform sampling, quantization, and analog transfer. As shown for this approach, the first stage 401-1 includes three phases per conversion round: a sampling phase, a quantization phase, and a transfer phase. A second stage 401-2 includes two phases: a quantization phase and a transfer phase.

A sample 403 of an analog signal is depicted progressing through the phases of the first and second stages 401-1 and 401-2. In the first stage 401-1, the sample 403 is sampled and quantized respectively in the sampling and quantization phases. At or near the end of the quantization phase, the first stage 401-1 produces a first digital value 405-1 for the sample 403. After the quantization phase is completed, the first stage 401-1 begins the transfer phase.

Thus, in the first stage 401-1, the quantization phase and the transfer phase occur sequentially at different times. As shown, the quantization phase and the transfer phase may be completely separated with no temporal overlap. During the transfer phase of the first stage 401-1, the first stage 401-1 transfers an indication of the sample 403 to the second stage 401-2 at 407. Accordingly, the second stage 401-2 accepts the indication of the sample 403 at the transfer phase of the second stage 401-2. In a next or succeeding conversion round, the second stage 401-2 can further quantize the sample 403 based on this indication. The second stage 401-2 produces a second digital value 405-2 for the sample 403 in the quantization phase of the next conversion round.

FIG. 4-2 illustrates, at 400-2 generally, two stages 132-1 and 132-2 of a pipelined ADC 130 (e.g., of FIGS. 1-3) in which an example first stage 132-1 uses two phases to perform sampling, quantization, and analog transfer by at least partially overlapping the quantization and the analog transfer operations. This temporal overlap enables the pipelined ADC 130 to accelerate the conversion of an analog signal into a set of output bits for a digital signal as compared to the approach described above for FIG. 4-1. As shown for the example approach of FIG. 4-2, the first stage 132-1 includes two phases per conversion round: a sampling phase 406 and a quantization and transfer phase 408. A second stage 132-2 includes two phases: a quantization phase 410 and a transfer phase 412.

For certain example operations, a sample 402 of an analog signal is depicted progressing through the phases of the first and second stages 132-1 and 132-2. In the first stage 132-1, the pipelined ADC 130 obtains the sample 402 during the sampling phase 406. The pipelined ADC 130 quantizes the analog sample 402 in the quantization and transfer phase 408. At or near the end of the quantization and transfer phase 408, the first stage 132-1 can produce a first digital value 302-1. Meanwhile, during at least part of the quantization and transfer phase 408, the pipelined ADC 130 is also performing a transfer of analog information that is related to the sample 402.

Thus, in the first stage 132-1, the quantization act and the transfer act occur at least partially during overlapping time periods. As shown, the quantization act and the transfer act may substantially overlap, such as if each is based on a same signal like an output signal of a comparator. During the transfer act of the quantization and transfer phase 408 of the first stage 132-1, the first stage 132-1 transfers an indication of the sample 402 to the second stage 132-2 at 404. Accordingly, the second stage 132-2 accepts the analog indication of the sample 402 at the transfer phase 412 of the second stage 132-2. The transfer of analog information to the second stage 132-2 from the first stage 132-1 therefore starts while the first stage 132-1 has not completed quantizing the analog sample 402. In a following or succeeding conversion round (e.g., a next or succeeding consecutive conversion round), the second stage 132-2 can further quantize the sample 402 based on the transferred indication of the sample. Thus, the second stage 132-2 can produce a second digital value 302-2 for the sample 402 in the quantization phase 410 of the next conversion round.

By overlapping the quantization and transfer operations of the first stage 132-1 in the quantization and transfer phase 408, the second stage 132-2 receives an indication of the sample 402 of the analog signal being converted sooner as compared to the approach described above for FIG. 4-1. This shortens a length of operating for the first stage 132-1 and enables the pipelined ADC 130 to operate at a higher bandwidth. Circuitry examples that can overlap these actions into a combined phase of operation for a pipelined ADC 130 are described next with reference to FIGS. 5-7.

Figure 5:
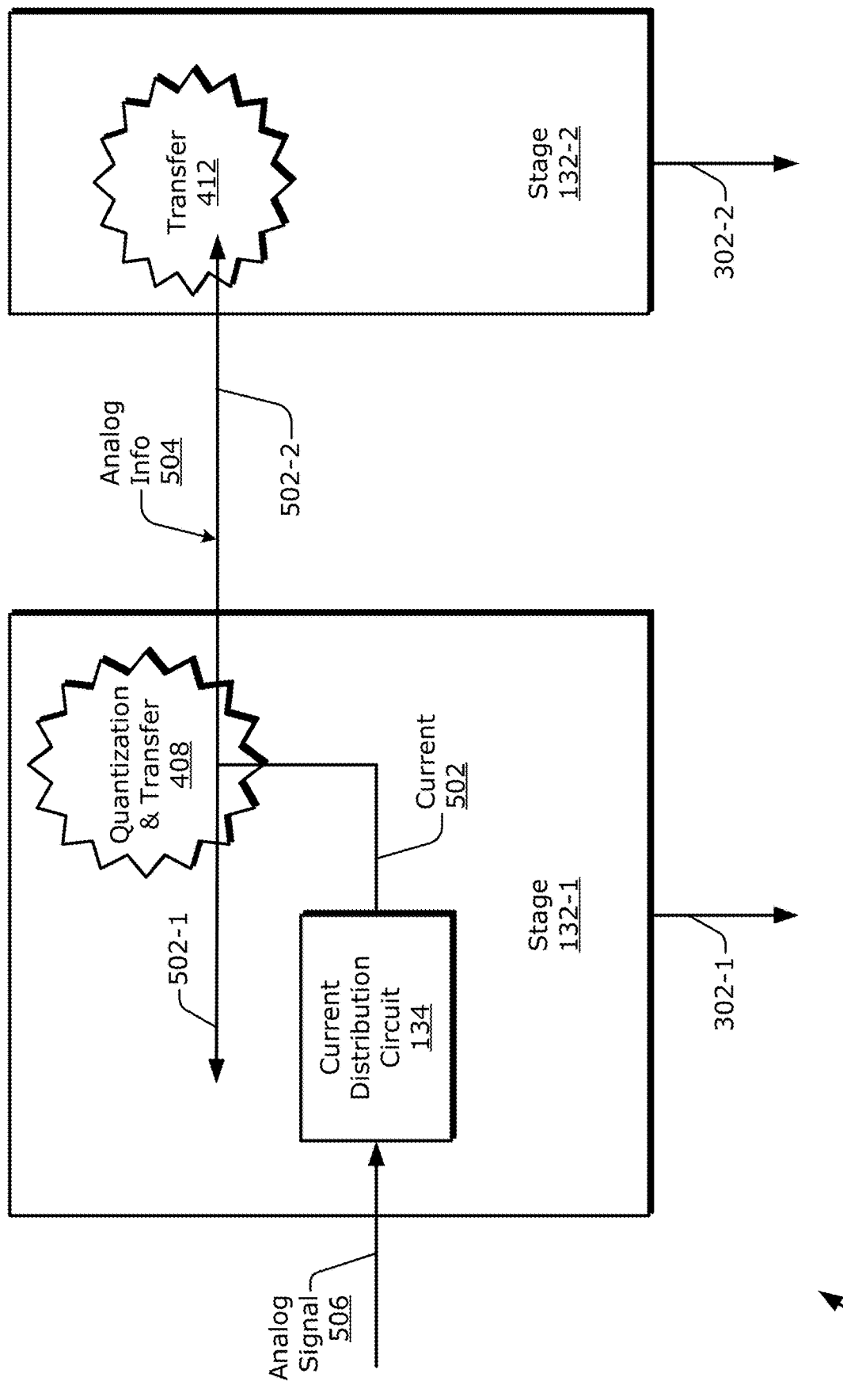
FIG. 5 is a schematic diagram illustrating multiple stages of a pipelined ADC in which an example first stage includes a current distribution circuit that can transfer analog information to a second stage at least partially during a quantization operation.

FIG. 5 is a schematic diagram 500 illustrating multiple stages 132-1 to 132-2 of a pipelined ADC 130 (e.g., of FIGS. 1-3) in which an example first stage 132-1 includes a current distribution circuit 134 that can transfer analog information to a second stage 132-2. In example implementations, the current distribution circuit 134 can operate based on an analog signal 506, such as an analog input signal 212 (of FIGS. 2 and 3). If the first stage 132-1 is not an initial stage of the pipelined ADC 130, the current distribution circuit 134 can operate on an analog residue signal 304 (of FIG. 3). Generally, the current distribution circuit 134, as well as the first stage 132-1, can operate based on an analog signal 506 from a variety of sources or origins.

Based on the analog signal 506, such as responsive to an analog sample thereof, the current distribution circuit 134 can apply at least one current 502. The current distribution circuit 134 can apply the at least one current 502 to at least one component (not shown in FIG. 5) of the first stage 132-1 as part of a quantization and transfer phase 408 (of FIG. 4-2). The current distribution circuit 134 can also apply the at least one current 502 to at least one component (not shown in FIG. 5) of the second stage 132-2 as part of the quantization and transfer phase 408 and as part of a transfer phase 412.

The current 502 can be applied as a same current or a same current signal to the component of the first stage 132-1 and to the component of the second stage 132-2. Alternatively, the current distribution circuit 134 can apply a first current 502-1 (or a first current signal 502-1) to the component of the first stage 132-1 and a second current 502-2 (or a second current signal 502-2) to the component of the second stage 132-2, e.g., using at least one current mirror. The current 502, including a second current 502-2, can provide analog information 504 related to the analog signal 506. The analog information 504 may correspond, for instance, to a sample of the analog signal 506, which is described next with reference to FIG. 6.

Figure 6:
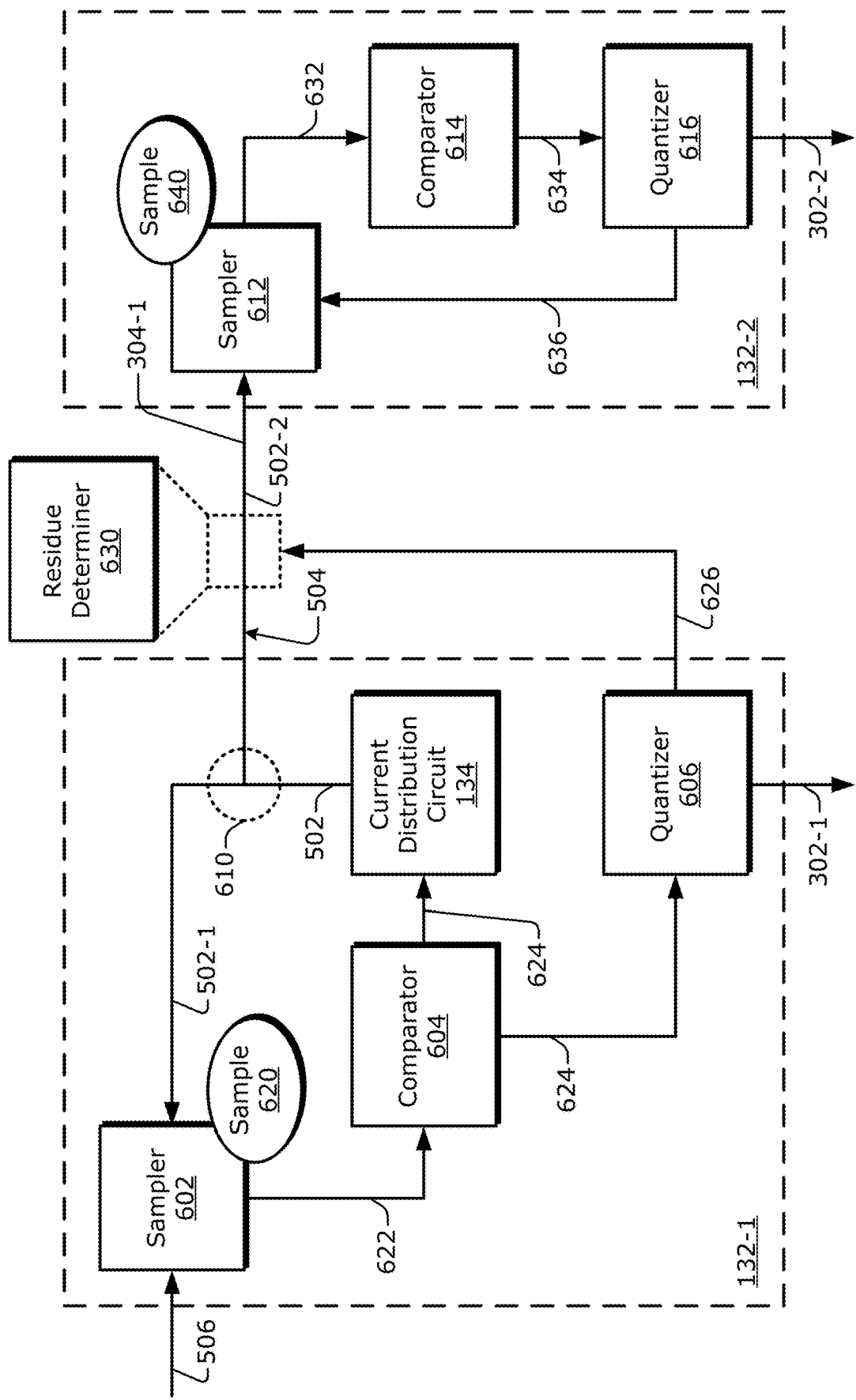
FIG. 6 is a schematic diagram illustrating multiple stages of a pipelined ADC in which an example first stage includes a current distribution circuit that is coupled to a sampler of the first stage and a sampler of an example second stage.

FIG. 6 is a schematic diagram 600 illustrating multiple stages 132-1 to 132-2 of a pipelined ADC 130 (e.g., of FIGS. 1-3) in which an example first stage 132-1 includes a current distribution circuit 134 that is coupled to a sampler 602 of the first stage 132-1 and a sampler 612 of an example second stage 132-2. As illustrated, the first stage 132-1 can include a comparator 604 and a quantizer 606, in addition to the sampler 602 and the current distribution circuit 134. The second stage 132-2 can include a comparator 614 and a quantizer 616, in addition to the sampler 612. The schematic diagram 600 also depicts a residue determiner 630. The residue determiner 630 may be part of the first stage 132-1, part of the second stage 132-2, or separate from both stages.

In example implementations, with respect to the first stage 132-1, the sampler 602 is coupled to the comparator 604 and the current distribution circuit 134. The comparator 604 is coupled to the current distribution circuit 134 and the quantizer 606. The comparator 604 is coupled between the sampler 602 and the current distribution circuit 134. The comparator 604 is also coupled between the sampler 602 and the quantizer 606. For example, the sampler 602 can be coupled to an input of the comparator 604, and the current distribution circuit 134 and the quantizer 606 may be coupled to at least one output of the comparator 604. The residue determiner 630 can be coupled to the current distribution circuit 134, the quantizer 606, and the sampler 612 of the second stage 132-2.

With respect to the second stage 132-2, the sampler 612 is coupled to the comparator 614 and the quantizer 616. The comparator 614 is coupled to the quantizer 616. Thus, the quantizer 616 is coupled to the sampler 612 and the comparator 614. The comparator 614 is coupled between the sampler 612 and the quantizer 616. For example, the sampler 612 can be coupled to an input of the comparator 614, and the quantizer 616 can be coupled to an output of the comparator 614. The quantizer 606 and the quantizer 616 may be coupled to the register 306 (of FIG. 3) to provide the first digital value 302-1 and the second digital value 302-2, respectively, to the register 306 for encoding as the digital output signal 214.

In example operations, the sampler 602 receives the analog signal 506 and obtains a sample 620—e.g., an analog sample 620—of the analog signal 506. The sample 620 can correspond to a voltage level of the analog signal 506 at some instant or over some sampling interval. The sampler 602 provides the sample 620 to the input of the comparator 604 as a sampling output signal 622. The comparator 604 compares the sample 620 to another voltage. The other voltage can correspond to a reference voltage, a common-mode voltage (cm voltage), a ground voltage, a zero-volt voltage, an opposite voltage in a differential signaling environment, and so forth. Based on the comparison, the comparator 604 outputs a comparison signal 624 to the current distribution circuit 134 and the quantizer 606. Based on the comparison signal 624, the quantizer 606 begins quantizing the analog sample 620 of the analog signal 506.

Based on the comparison signal 624 from the comparator 604, the current distribution circuit 134 producers at least one current 502. The current distribution circuit 134 applies the current 502 to the sampler 602 of the first stage 132-1 and to the sampler 612 of the second stage 132-2. The current distribution circuit 134 may also provide the current 502 to the residue determiner 630. In some cases, by applying the current 502 to the sampler 602, the current distribution circuit 134 adjusts (e.g., can decrease) the voltage at the sampler 602. For instance, the current distribution circuit 134 can discharge at least one capacitor of the sampler 602. By applying the current 502 to the sampler 612, the current distribution circuit 134 can adjust (e.g., increase) a voltage at the sampler 612. For instance, the current distribution circuit 134 can charge at least one capacitor of the sampler 612. In this manner, the current distribution circuit 134 can provide the analog information 504 about the sample 620 from the analog signal 506 to the sampler 612 of the second stage 132-2 while the quantizer 606 of the first stage 132-1 is converting the sample 620 of the analog signal 506.

The comparator 604 can continue to monitor the voltage at the sampler 602 as it varies over time. Responsive to the comparator 604 determining that the voltage from the sampler 602 has reached (e.g., equaled or crossed) the other voltage to which it is being compared, the comparator 604 changes the comparison signal 624 (e.g., from a logical one—such as a high voltage value—to a logical zero—such as a low voltage value, or vice versa). The changed comparison signal 624 causes the quantizer 606 to stop quantizing the sample 620. The changed comparison signal 624 also causes the current distribution circuit 134 to cease supplying the at least one current 502 to the samplers 602 and 612. At this point for this example, the quantizer 606 has completed quantizing the sample 620, and the current distribution circuit 134 has completed transferring the analog information 504 to the sampler 612.

To determine the first analog residue signal 304-1, the quantizer 606 can provide an adjustment signal 626 to the residue determiner 630. The adjustment signal 626 may be similar or equivalent to the first digital value 302-1 or analog version thereof. The quantizer 606 may provide the adjustment signal 626 to the residue determiner 630 via, for instance, a DAC (not shown in FIG. 6). The residue determiner 630 combines the transferred analog information 504 and the adjustment signal 626 to determine an analog residue voltage for the sampler 612 to sample. With respect to the example components illustrated in FIG. 6 for the second stage 132-2, the comparator 614 can use a comparison signal 634 to cause the quantizer 616 to quantize the first analog residue signal 304-1 at the sampler 612 based on a sampling output signal 632, which corresponds to a sample 640 of the first analog residue signal 304-1. This quantization by the quantizer 616 can continue, for example, while the voltage at the sampler 612, as represented by the sampling output signal 632, is non-zero or while a quantized output signal 636 does not yet match the voltage at the sampler 612. The quantized output signal 636 may be similar or equivalent to the second digital value 302-2 or an analog version thereof.

The quantizer 606 can provide the adjustment signal 626 to the residue determiner 630 with any of multiple different timings. With one example timing, the quantizer 606 can provide the multiple bits of the adjustment signal 626 to the residue determiner 630 substantially simultaneously or together after the adjustment signal 626 is ascertained—e.g., after the quantizer 606 completes this conversion round. With an alternative timing, the quantizer 606 can provide the adjustment signal 626 to the residue determiner 630 on a bit-by-bit basis as each bit of the adjustment signal 626 is ascertained. With the alternative timing, which is described further below with reference to FIGS. 10-1 and 10-2, the voltage at the residue determiner 630 and the sampler 612 is moderated during the conversion process portion that is performed by the first stage 132-1.

As represented by the encircled portion 610, the at least one current 502 can be applied to the sampler 602 and the sampler 612 in different manners. For example, a common or same current 502 may be routed to the sampler 602 and the sampler 612. Example implementations with a common current are described below with reference to FIGS. 8, 9-1, and 9-2. In an alternative example, the at least one current 502 may include a first current 502-1 and a second current 502-2. With this alternative example, the current distribution circuit 134 may route the first current 502-1 to the sampler 602 and route the second current 502-2 to the sampler 612. The first and second currents 502-1 and 502-2 may be equal or proportional to each other by creating one current from the other using at least one current mirror. Example implementations involving two currents and a current mirror are described below with reference to FIGS. 7, 10-1, and 10-2.

Figure 7:
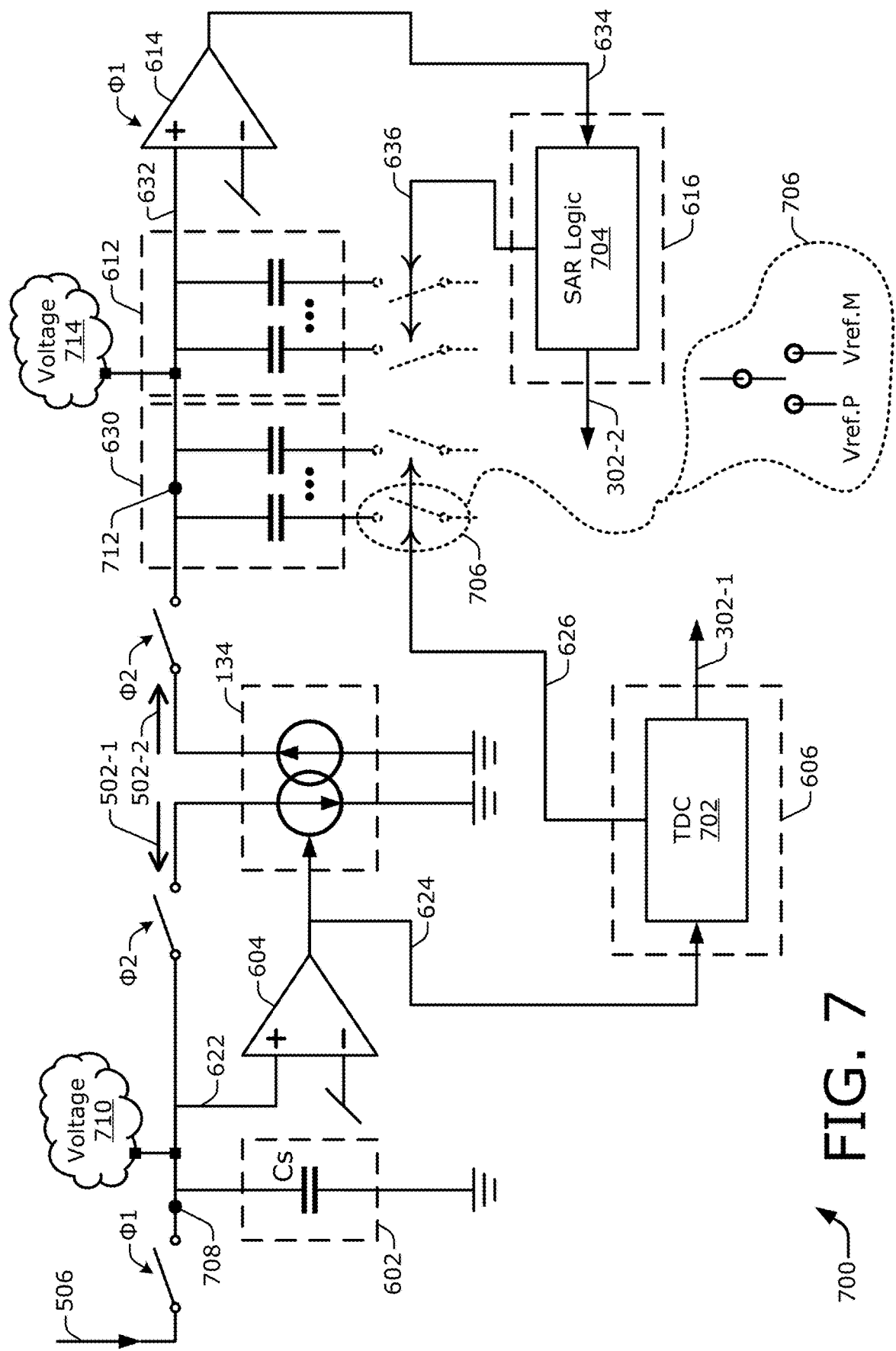
FIG. 7 is a circuit diagram illustrating multiple stages of a pipelined ADC in which an example first stage includes a current distribution circuit that is coupled to a sampler of the first stage and a sampler of an example second stage.

FIG. 7 is a circuit diagram 700 illustrating multiple stages of a pipelined ADC in which an example first stage includes a current distribution circuit 134 that is coupled to a sampler 602 of the first stage and a sampler 612 of an example second stage. The circuit diagram 700 depicts an example implementation for a pipelined ADC 130 (e.g., of FIGS. 1-3). As shown, the sampler 602 can be realized using at least one capacitor (e.g., a sampling capacitor Cs). In the illustrated case, the capacitor is coupled between a sampling node 708 and a ground. The sampling node 708 can hold the sample 620 (of FIG. 6) as a voltage 710. Although one capacitor is explicitly shown in FIG. 7, the sampler 602 may include multiple capacitors. Further, each depicted capacitor may be constructed using multiple capacitors, such as multiple capacitors that are coupled together in parallel.

The comparator 604 of the first stage 132-1 (as indicated in FIG. 6 with long dashed lines) and the comparator 614 of the second stage 132-2 are each depicted as receiving at an input node thereof a voltage from a sampling node of the sampler 602 and the sampler 612, respectively. For example, the comparator 604 can receive the voltage 710 on the sampling node 708 at an input of the comparator 604. A comparator may be realized in different manners. For example, the comparator 604 may be implemented with an asynchronous comparator that compares voltages present at a first input and a second input and produces an output signal based on the presented voltages. The output signal can indicate which of the two voltages is greater than or less than the other—e.g., using a digital or Boolean signal. Examples of comparators 604 include a reference-crossing detector that compares a voltage to a reference voltage, a zero-crossing detector (ZCD) that compares a voltage to zero volts or a ground voltage level, an analog amplifier that is operated like a digital asynchronous comparator, a combination thereof (e.g., a zero-crossing amplifier (ZCA)), and so forth.

In the depicted example implementation, the current distribution circuit 134 is implemented with at least one current mirror to produce a first current 502-1 and a second current 502-2. The comparator 604 can control a flow of the at least one current 502 using the comparison signal 624. The quantizer 606 of the first stage 132-1 can be implemented using a time-to-digital converter 702 (TDC 702). The TDC 702 may employ, for instance, at least one ring oscillator and a counter to track elapsed time. In the second stage 132-2, the quantizer 616 can be implemented using successive approximation register (SAR) logic 704 (SAR logic 704). Other quantizing hardware and techniques, however, may be used instead. Quantizing examples include a flash or direct-conversion ADC, an asynchronous digital ramp ADC, and so forth.

The residue determiner 630 can be implemented using, for example, a DAC at a node 712. The DAC includes multiple capacitors and multiple switches. Although a pair of capacitors and a pair of switches are explicitly depicted, more or fewer capacitors and/or switches may be implemented. Each respective switch of the multiple switches is coupled in series with a respective capacitor of the multiple capacitors. Each switch 706 can be implemented in different ways. In a differential environment, each switch 706 can enable a plate of the capacitor that is opposite the node 712 of the residue determiner 630 to be coupled to a plus reference voltage (Vref.P) or a minus reference voltage (Vref.M). The TDC 702 can control which switches are placed in an open state or a closed state using the adjustment signal 626. Although shown separately, the first digital value 302-1 can be realized using the adjustment signal 626 in some cases.

By setting states of the multiple switches, the TDC 702 can use the adjustment signal 626 to apply the quantized portion of the sample 620 (of FIG. 6) to a voltage 714 that is transferred to the node 712 by the current distribution circuit 134 to determine a difference. In this case, the residue determiner 630 can determine the voltage difference, which corresponds to an analog residue voltage of the first analog residue signal 304-1 (e.g., of FIGS. 3 and 6). Thus, the analog residue voltage is presented on the node 712. In this example, the node 712 of the residue determiner 630 is common with a sampling node of the sampler 612 of the second stage 132-2. Each of the residue determiner 630 and the sampler 612 may, however, have separate nodes in alternative implementations.

In an example operation, the Φ1 components are active in a first period. For example, the Φ1 switch closes and the comparator 614 can operate during a first period. By closing the Φ1 switch, the capacitor of the sampler 602 can obtain the sample 620 of the analog signal 506 as the voltage 710. During this first period, the comparator 614 can function with the SAR logic 704 to determine less significant bits of a previous sample based on an analog residue voltage (e.g., the voltage 714) present at an input of the comparator 614 (e.g., a voltage that is present at the node 712).

At a second period, the Φ1 switch opens, and the two Φ2 switches close. The current distribution circuit 134 can therefore route the first and second currents 502-1 and 502-2 to respective samplers 602 and 612 based on the voltage 710 of the sample 620 as present on the capacitor of the sampler 602. Using the at least one current 502, the current distribution circuit 134 transfers analog voltage information to the sampler 612 while the TDC 702 is quantizing the voltage 710 of the sample 620. Thus, quantization and transfer acts may overlap with each other and/or be combined into a single phase. When the present second period concludes based on the comparator 604 detecting that the voltage 710 of the capacitor matches another voltage, the Φ2 switches can open, and the residue determiner 630 can produce the analog residue voltage as the "new" voltage 714 at the node 712. Thus, the second stage 132-2 can quantize the analog residue voltage present at the node 712 using the SAR logic 704 and the sampler 612.

In some cases, the sampler 612 can be realized as a DAC. Thus, the sampler 612 can include multiple capacitors and multiple switches. Each respective switch of the multiple switches is coupled in series with a respective capacitor of the multiple capacitors. The successive approximation register logic 704 (SAR logic 704) can set respective states of respective switches of the multiple switches based on an output of the comparator 614 of the second stage 132-2 using the quantized output signal 636. Although shown separately, the second digital value 302-2 can be realized using the quantized output signal 636 in some cases. Further, each respective capacitor of the multiple capacitors includes a first plate (e.g., the "upper" plate as depicted) and a second plate (e.g., the "lower" plate as depicted). Each respective switch of the multiple switches is coupled to the second plate of the respective capacitor of the multiple capacitors. The current distribution circuit 134 is coupled to the first plate of each respective capacitor of the multiple capacitors (e.g., via the node 712). A DAC of the residue determiner 630 may be combined with a DAC of the sampler 612, including with a common node 712 as shown in the example schematic diagram 700. Example implementations including a combined DAC are described next with reference to FIG. 8.

Figure 8:
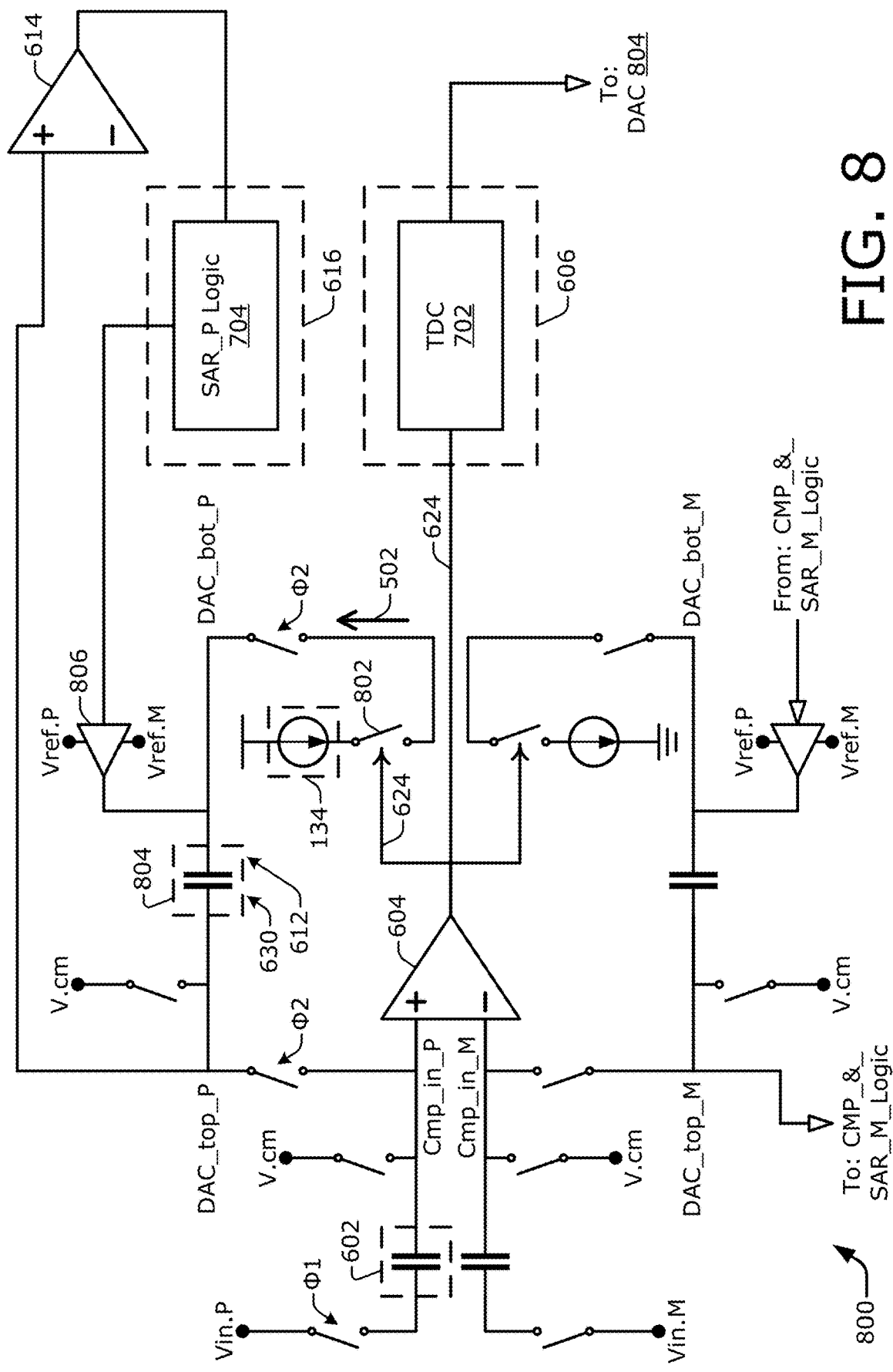
FIG. 8 is a circuit diagram illustrating an example pipelined ADC with differential signaling in which a same current can be routed to respective samplers of first and second stages of the pipelined ADC.

FIG. 8 is a circuit diagram 800 illustrating an example pipelined ADC with differential signaling in which a same current can be routed to respective samplers of first and second stages of the pipelined ADC. In the upper half of the circuit diagram 800, plus differential components are depicted. Some minus differential components are depicted in the lower half of the circuit diagram 800; for clarity, however, some minus differential components are omitted from FIG. 8. Operation of the plus differential components is described below. Because operation of the minus differential components is complementary, description thereof has been omitted for brevity.

In example implementations, the switches coupled to a common-mode voltage (V .cm) are closed to reset the capacitors of the sampler 602 and the capacitors of the DAC 804. As shown, the DAC 804 can be realized with a combination of the residue determiner 630 and the sampler 612 of the second stage 132-2 (as explicitly indicated in FIG. 6). The DAC 804 includes a plus top plate (DAC_top_P) and plus bottom plate (DAC_bot_P). Single items of a capacitor for the DAC 804, a buffer 806, a line from the plus SAR logic 704, a switch coupled to the plus bottom plate (DAC_bot_P), and other lines coupled to the capacitor of the DAC 804 are shown for clarity. Multiple instances of these items, however, may be present to accommodate multiple capacitors, multiple switches, control signaling to the switches, and so forth.

The resetting of the capacitors can occur during a first period. In the first period, the Φ1 switch is in a closed state while the Φ2 switches are in an open state. With these switch states, a plus input voltage (Vin.P) is coupled to a plate of the capacitor of the sampler 602, and the sampler 602 obtains a sample of the plus input voltage (Vin.P). In a second period, the Φ1 switch is in an open state while the Φ2 switches are in a closed state. The closed state of the Φ2 switches enables quantization and transfer to begin. An asserted or active comparison signal 624, which is output by the comparator 604, triggers the TDC 702 to convert elapsing time into a digital value.

The comparison signal 624 also closes a switch 802 to enable at least one current 502 to flow from at least one current source of the current distribution circuit 134. In this case, a shared, same, or common current 502 is applied to the sampler 602 and the DAC 804, which includes the sampler 612. The current distribution circuit 134 routes the same current 502 to the at least one capacitor of the sampler 602 and the at least one capacitor of the sampler 612. The flowing current 502 can discharge the capacitor of the sampler 602 while charging the capacitor of the sampler 612.

Using a same current for charging and discharging can provide several advantages. By using the same current, the architecture of the schematic diagram 800 avoids mismatches with the transfer of charge between the capacitors. The gain can also be defined by the ratio of capacitors. Further, a signal-dependent charge injection of the current sources can be reduced by controlling a timing of the switch at the plus top plate (DAC_top_P) of the DAC 804.

A same-current architecture, however, can create or intensify one or more potential error(s). First, the output of the current source of the current distribution circuit 134 experiences a large swing as the charge is transferred between capacitors. This strains the circuit's ability to operate linearly. Second, linearity can be further reduced by a delay of the comparator 604. Generally, distortion can increase proportionally to a product of the comparator delay and the output swing. These drawbacks can be managed, to at least some extent, using two current sources with associated currents having different magnitudes. Examples of this scheme are described with reference to FIGS. 9-1 and 9-2.

Figures 1, 9:
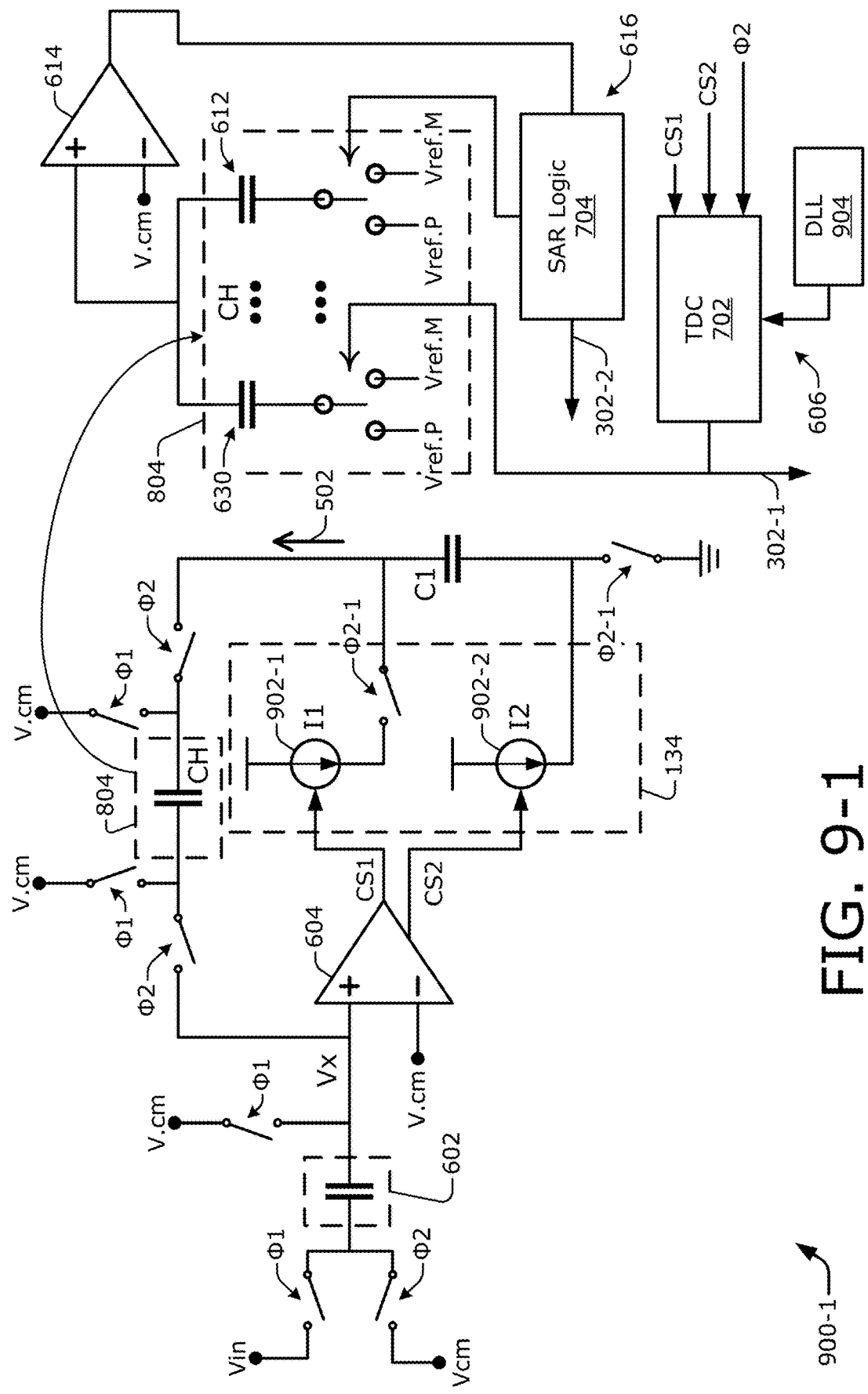
Figures 2, 9:
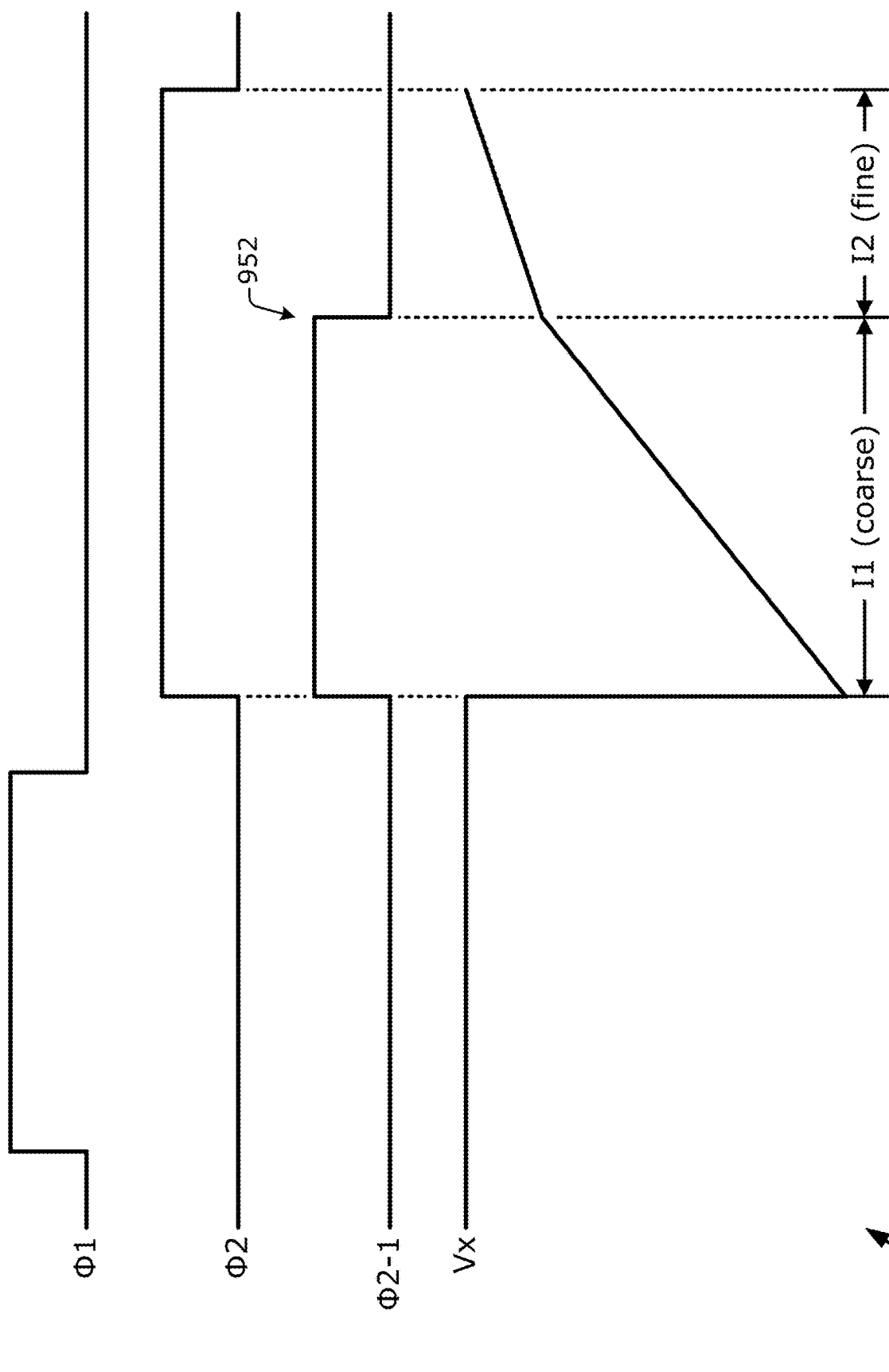

FIG. 9-1 is a circuit diagram 900-1 illustrating an example pipelined ADC in which a same current can be routed to respective samplers of first and second stages of the pipelined ADC and in which a magnitude of the same current can be adjusted. FIG. 9-2 is a graph 900-2 illustrating example circuit values for the circuit diagram of FIG. 9-1. An example of the DAC 804, which can include the residue determiner 630 and the sampler 612, is shown. The TDC 702 is coupled to a delay-locked loop 904 (DLL 904). The delay-locked loop 904 can adjust a speed at which the TDC 702 operates to account for the different current magnitudes.

In example implementations, the TDC 702 receives three control input signals: CS1, CS2, and Φ2. The Φ2 signal starts the TDC 702. The CS1 and CS2 signals correspond to output signals of the comparator 604 responsive to comparing the sample voltage on the capacitor of the sampler 602. The illustrated switches have open and closed states in dependence on the value of the Φ1 and Φ2 signals and a Φ2-1 signal. Associated switches are closed responsive to high values of these signals. Example values for the Φ1, Φ2, and Φ2-1 signals are depicted in FIG. 9-2. The graph 900-2 also shows voltage values for an input node of the comparator 604, which is identified with "Vx." The Φ2-1 signal controls the switches that are coupled to the outputs of the current sources 902-1 and 902-2 of the current distribution circuit 134.

The current distribution circuit 134 includes a first current source 902-1 and a second current source 902-2. The first current source 902-1 provides a first current I1 having a first magnitude, and the second current source 902-2 provides a second current I2 having a second magnitude. The second current I2 has a lower magnitude than the first current I1. In other words, the first magnitude is greater than the second magnitude. In operation generally, the current distribution circuit 134 applies the at least one current 502 by applying the first current I1 before the second current I2.

During a first portion of a conversion round (after the input voltage (Vin) has been sampled, as per the graph 900-2, the Φ2-1 switches are in a closed state along with the Φ2 switches. During a second portion of the conversion round, as delineated by 952, the Φ2-1 switches are open while the Φ2 switches remain closed. With closed Φ2-1 switches during the first portion of the round, the higher-magnitude current I1 is flowing to the capacitors as the lower-magnitude current I2 is shunted to ground. After the Φ2-1 switches are opened, the lower-magnitude current I2 is flowing to the capacitors to shift the charge thereon.

The effect of this current-magnitude change on the voltage Vx is shown in the graph 900-2. The voltage Vx increases more quickly responsive to the current I1 as compared to the current I2. Thus, the current 502 decreases the voltage (e.g., a sampled voltage) corresponding to the sampler 602 of the first stage 132-1 at a slower rate based on the second current I2 than based on the first current I1. Further, the current 502 increases a voltage Vx corresponding to the sampler 612 of the second stage 132-2 at a slower rate based on the second current I2 than based on the first current I1.

In other words, the charge transfer operation can be separated into two portions with two current sources (e.g., coarse and fine). During the first coarse portion, the capacitor C1 is used to store the output voltage estimation. As the comparator nears reaching a first threshold, the coarse current source (I1) is turned off, and the fine current source (I2) is switched in to continue the charge transfer through the capacitor C1. The amount of voltage overshoot is reduced because the voltage is changing more slowly while the comparator 604 experiences a delay between when Vx reaches a second threshold and the comparator 604 indicates this crossing on the output side of the comparator 604. Another advantage of this two-current implementation is that the output swing of the fine current source is significantly reduced as compared to the single-current implementation of FIG. 8 because its output charging of the DAC capacitor CH is through the capacitor C1.

Figures 1, 10:
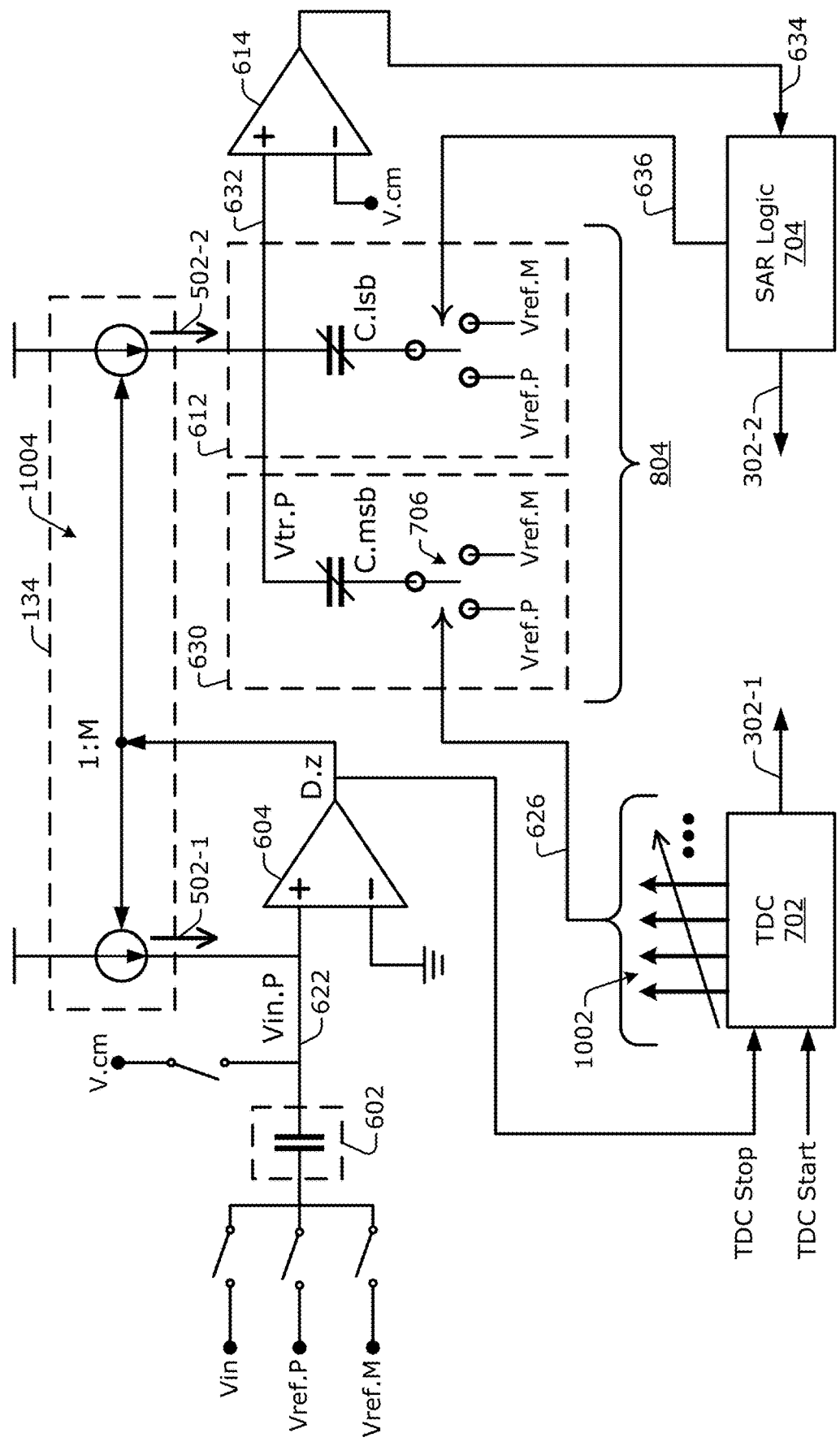
Figures 2, 10:
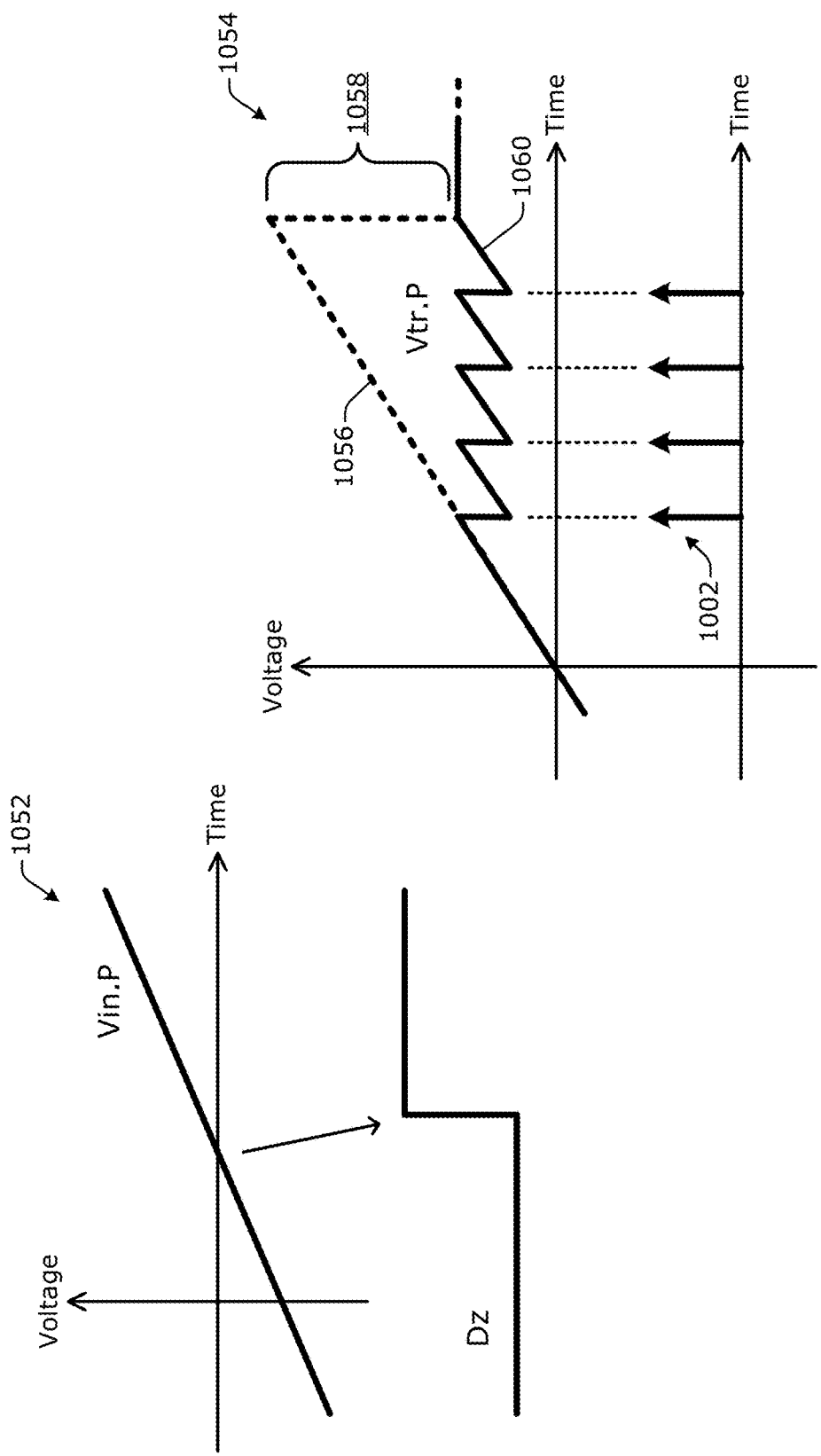

FIG. 10-1 is a circuit diagram 1000-1 illustrating an example pipelined ADC in which respective currents can be routed to respective samplers of first and second stages of the pipelined ADC using at least one current mirror. FIG. 10-2 includes graphs, at 1000-2 generally, illustrating example circuit values for the circuit diagram of FIG. 10-1. In example implementations, the current distribution circuit 134 includes two current sources arranged into a current mirror 1004. A first current source can produce a first current 502-1, and a second current source can produce a second current 502-2. The second current 502-2 can be a mirrored current, or a replicated current, relative to the first current 502-1. As indicated by "1:M" in FIG. 10-1, the mirrored current may be a scaled version (e.g., by a factor of "M") of the first or primary current. In some cases, each current source of the current mirror may be implemented as two current sources having different magnitudes in accordance with the techniques of FIGS. 9-1 and 9-2.

The first current source provides the first current 502-1 to the sampler 602 to reduce the charge thereon. This can increase the plus input voltage (Vin.P) at the comparator 604. The corresponding change to the plus input voltage is depicted in a graph 1052 of FIG. 10-2. Responsive to the plus input voltage (Vin.P) crossing a threshold (e.g., a zero-volt value or a common-mode voltage), the comparator 604 changes the output signal Dz to stop the TDC 702 and the current sources of the current distribution circuit 134.

A graph 1054 of FIG. 10-2 depicts operation of the TDC 702 between the TDC being started and the TDC being stopped. The upper portion of the graph 1054 shows two approaches for changing the plus transfer voltage (Vtr.P), which may correspond to a "top" plate of the capacitors of the residue determiner 630, of the sampler 612, or of a combination thereof (e.g., the DAC 804). As a digital value of the TDC 702 is incremented, the TDC 702 can produce ticks 1002 that reflect changes to the bits of the digital value 302-1 that is being generated. The lower portion of the graph 1054 depicts the ticks 1002 of the TDC 702. The TDC 702 can couple the bits together (e.g., substantially simultaneously) to the residue determiner 630 after determination of the digital value 302-1 is completed. This approach corresponds to the dashed line 1056. The residue determination operation is performed "all at once" in this case, which leads to a large voltage for the plus transfer voltage (Vtr.P) and a corresponding large voltage swing 1058.

In contrast, the TDC 702 can iteratively apply the first digital value 302-1 by setting a state of each switch 706 as the TDC 702 generates a tick 1002. This approach corresponds to the solid line 1060. This approach can repeatedly reduce the plus transfer voltage (Vtr.P) at the output of the second current source and the input of the comparator 614. Accordingly, the residue determination operation can be complete, or nearly complete, when the voltage Dz goes high in the graph 1052.

Figure 11:
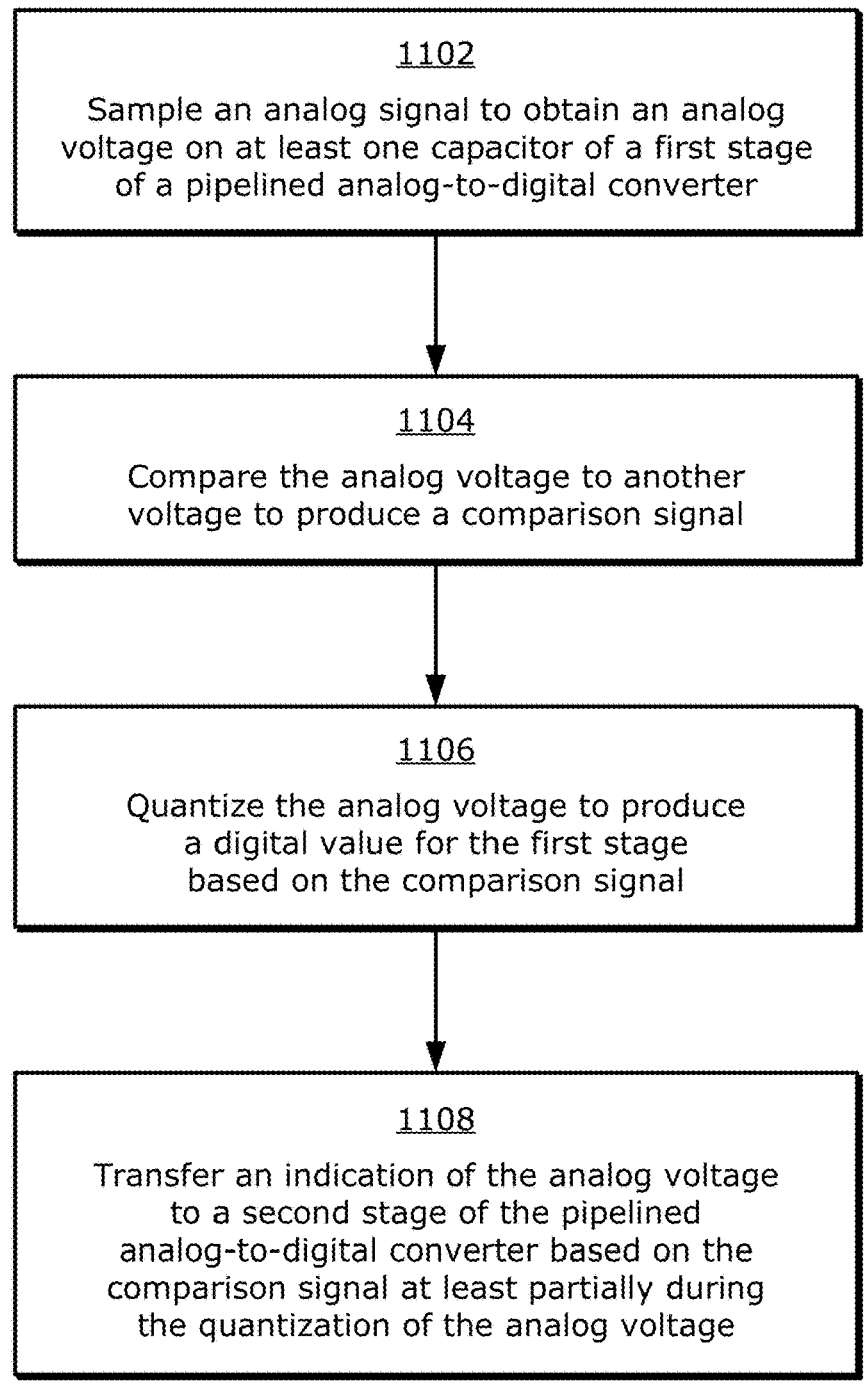
FIG. 11 is a flow diagram illustrating an example process for pipelined analog-to-digital conversion and/or for operating a pipelined ADC.

FIG. 11 is a flow diagram illustrating an example process 1100 for pipelined analog-to-digital conversion and/or for operating a pipelined analog-to-digital converter. The process 1100 is described in the form of a set of blocks 1102-1108 that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the process 1100 or an alternative process. Operations represented by the illustrated blocks of the process 1100 may be performed by a pipelined ADC 130 or a portion thereof. More specifically, the operations of the process 1100 may be performed by a first stage 132-1 and a second stage 132-2.

At block 1102, a pipelined ADC is sampling an analog signal to obtain an analog voltage on at least one capacitor of a first stage of the pipelined analog-to-digital converter. For example, a pipelined ADC 130 can sample an analog signal 506 to obtain an analog voltage 710 on at least one capacitor Cs of a first stage 132-1 of the pipelined ADC 130. For instance, as part of a sampling phase 406, a sampler 602 may obtain an analog sample 620 of a signal being converted from an analog version to a digital version.

At block 1104, the pipelined ADC is comparing the analog voltage to another voltage to produce a comparison signal. For example, the pipelined ADC 130 can compare the analog voltage 710 to another voltage to produce a comparison signal 624. In some cases, as part of a quantization and transfer phase 408, a comparator 604 may determine if the analog voltage 710 crosses (e.g., matches or passes as the analog voltage changes along a given direction) another voltage that is being input to the comparator 604. The other voltage may correspond to a zero voltage, a ground voltage, a reference voltage, a common-mode voltage in a differential environment, some combination thereof, and so forth.

At block 1106, the pipelined ADC is quantizing the analog voltage to produce a digital value for the first stage based on the comparison signal. For example, the pipelined ADC 130 can quantize the analog voltage 710 (as originally sampled) to produce a digital value 302-1 for the first stage 132-1 based on the comparison signal 624. To do so, a time-to-digital converter 702 (TDC 702) may convert elapsing time to a digital value, which may be stored in a counter, as part of the quantization and transfer phase 408. The TDC 702 may terminate the conversion and cease increasing the counter responsive to a change to the comparison signal 624 to thereby convert a time period that is indicated by the comparator 604 to the digital value 302-1. Bits of the counter, which may correspond to the first digital value 302-1, may be applied to a residue determiner 630 responsive to the change to the comparison signal 624 on a bit-by-bit basis or may be applied to the residue determiner 630 as each bit is determined.

At block 1108, the pipelined ADC is transferring an indication of the analog voltage to a second stage of the pipelined analog-to-digital converter based on the comparison signal at least partially during the quantizing of the analog voltage. For example, the pipelined ADC 130 can transfer an indication of (e.g., provide a signal that communicates analog information 504 about) the analog voltage 710 to a second stage 132-2 of the pipelined ADC 130 based on the comparison signal 624 at least partially during the quantizing of the analog voltage 710. Here, a current distribution circuit 134 may apply current to a residue determiner 630 or a sampler 612 (including to both—e.g., with a common node 712) until the comparison signal 624 is changed.

The current routing may occur during the quantization and transfer phase 408 at least partially while the TDC 702 is converting time to the first digital value 302-1. This may be performed by adding charge to at least one capacitor of the residue determiner 630 (e.g., a capacitor CH) while removing charge from at least one capacitor of the sampler 602 (e.g., a capacitor Cs). The current distribution circuit 134 may discharge the sampler 602 and charge the residue determiner 630 using a same current 502 or using two related currents 502-1 and 502-1 (e.g., with one current being a replication or mirrored version of the other).

This section describes some aspects of example implementations and/or example configurations related to the apparatuses and/or processes presented above.

Example aspect 1: An apparatus comprising:
a pipelined analog-to-digital converter comprising:
  a first stage comprising:
    a sampler;
    a quantizer coupled to the sampler; and
    a current distribution circuit coupled to the sampler; and
  a second stage comprising:
    a sampler coupled to the current distribution circuit; and
    a quantizer coupled to the sampler of the second stage.

Example aspect 2: The apparatus of example aspect 1, wherein:
  the first stage comprises a comparator;
  the comparator is coupled between the sampler of the first stage and the current distribution circuit;
  the comparator is coupled between the sampler of the first stage and the quantizer of the first stage; and
  the quantizer of the first stage comprises a time-to-digital converter (TDC).

Example aspect 3: The apparatus of example aspect 1 or example aspect 2, wherein:
  the second stage comprises a comparator;
  the comparator of the second stage is coupled between the sampler of the second stage and the quantizer of the second stage; and
  the quantizer of the second stage comprises successive approximation register (SAR) logic.

Example aspect 4: The apparatus of example aspect 3, wherein:
  the sampler of the second stage comprises:
    multiple capacitors; and
    multiple switches, each respective switch of the multiple switches coupled in series with a respective capacitor of the multiple capacitors; and
  the successive approximation register (SAR) logic is configured to set respective states of respective switches of the multiple switches based on an output of the comparator of the second stage.

Example aspect 5: The apparatus of example aspect 4, wherein:
  each respective capacitor of the multiple capacitors comprises a first plate and a second plate;
  each respective switch of the multiple switches is coupled to the second plate of the respective capacitor of the multiple capacitors; and
  the current distribution circuit is coupled to the first plate of each respective capacitor of the multiple capacitors.

Example aspect 6: The apparatus of any one of the preceding example aspects, further comprising:
  at least one switch coupled between an input of the first stage and the sampler of the first stage; and
  one or more switches coupled between the current distribution circuit and the sampler of the first stage and the sampler of the second stage.

Example aspect 7: The apparatus of any one of the preceding example aspects, wherein the current distribution circuit is configured to:
  apply at least one current to the sampler of the first stage and the sampler of the second stage.

Example aspect 8: The apparatus of example aspect 7, wherein the current distribution circuit is configured to:
  discharge the sampler of the first stage and charge the sampler of the second stage by applying the at least one current respectively to the sampler of the first stage and to the sampler of the second stage.

Example aspect 9: The apparatus of example aspect 8, wherein the current distribution circuit is configured to:
charge the sampler of the second stage at least partially while discharging the sampler of the first stage.

Example aspect 10: The apparatus of any one of example aspects 7-9, wherein:
the current distribution circuit comprises at least one current source; and
the at least one current source is configured to apply the at least one current by routing a same current to the sampler of the first stage and the sampler of the second stage.

Example aspect 11: The apparatus of any one of example aspects 7-9, wherein:
the current distribution circuit comprises a first current source and a second current source, the first and second current sources arranged into a current mirror;
the current mirror is configured to provide a first current and a second current; and
the current mirror is configured to apply the at least one current by routing the first current to the sampler of the first stage and the second current to the sampler of the second stage.

Example aspect 12: The apparatus of any one of example aspects 7-9, wherein:
the current distribution circuit comprises a first current source and a second current source;
the first current source is configured to provide a first current;
the second current source is configured to provide a second current, the second current having a lower magnitude than the first current; and
the current distribution circuit is configured to apply the at least one current by applying the first current before the second current.

Example aspect 13: The apparatus of example aspect 12, wherein the current distribution circuit is configured to:
decrease a voltage corresponding to the sampler of the first stage at a slower rate based on the second current than based on the first current; and
increase a voltage corresponding to the sampler of the second stage at a slower rate based on the second current than based on the first current.

Example aspect 14: The apparatus of any one of the preceding example aspects, wherein the first stage comprises:
a comparator coupled between the sampler of the first stage and the current distribution circuit, the comparator configured to control application of at least one current by the current distribution circuit.

Example aspect 15: The apparatus of example aspect 14, wherein:
the comparator is coupled between the sampler of the first stage and the quantizer of the first stage; and
the quantizer is configured to determine a digital value based on an output of the comparator.

Example aspect 16: The apparatus of example aspect 15, wherein the current distribution circuit is configured to:
provide, using the at least one current, analog information to the sampler of the second stage at least partially while the quantizer of the first stage is determining the digital value, the analog information related to an analog signal sampled by the sampler of the first stage.

Example aspect 17: The apparatus of example aspect 15 or example aspect 16, wherein the quantizer of the first stage comprises:

a time-to-digital converter (TDC), the time-to-digital converter (TDC) configured to convert a time period that is indicated by the comparator to the digital value.

Example aspect 18: The apparatus of any one of the preceding example aspects, wherein the pipelined analog-to-digital converter comprises:
a residue determiner coupled to the current distribution circuit and the quantizer of the first stage, wherein:
the current distribution circuit is configured to apply at least one current to the residue determiner; and
the quantizer of the first stage is configured to:
generate a digital value; and
provide the digital value to the residue determiner.

Example aspect 19: The apparatus of example aspect 18, wherein:
the quantizer of the first stage is configured to couple bits of the digital value to the residue determiner after the digital value is generated.

Example aspect 20: The apparatus of example aspect 18, wherein:
the quantizer of the first stage is configured to couple bits of the digital value to the residue determiner as the bits of the digital value are being generated.

Example aspect 21: The apparatus of any one of the preceding example aspects, wherein the pipelined analog-to-digital converter comprises:
a third stage comprising:
a sampler;
a quantizer coupled to the sampler of the third stage; and
a current distribution circuit coupled to the sampler of the third stage and the sampler of the first stage,
wherein the current distribution circuit of the third stage is configured to apply at least one current to the sampler of the third stage and the sampler of the first stage.

Example aspect 22: The apparatus of example aspect 21, wherein:
the current distribution circuit of the third stage is configured to provide, using the at least one current, first analog information to the sampler of the first stage at least partially while the quantizer of the third stage is determining a first digital value, the first analog information related to an analog signal sampled by the sampler of the third stage; and
the current distribution circuit of the first stage is configured to provide, using at least one other current, second analog information to the sampler of the second stage at least partially while the quantizer of the first stage is determining a second digital value, the second analog information related to the first analog information provided to the sampler of the first stage by the current distribution circuit of the third stage.

Example aspect 23: The apparatus of any one of the preceding example aspects, further comprising:
a wireless interface device,
wherein the wireless interface device comprises the pipelined analog-to-digital converter.

Example aspect 24: The apparatus of example aspect 23, further comprising:
a display screen; and
at least one processor operatively coupled to the display screen and at least a portion of the wireless interface device, the at least one processor configured to present one or more graphical images on the display screen based on one or more wireless signals received using the pipelined analog-to-digital converter of the wireless interface device.

Example aspect 25: An apparatus for pipelined analog-to-digital conversion, the apparatus comprising:

a first stage comprising:
a sampler configured to obtain a sample of an analog signal; and
a quantizer coupled to the sampler;
a second stage comprising:
a sampler; and
a quantizer coupled to the sampler of the second stage; and
means for distributing current to the sampler of the first stage and the sampler of the second stage based on the sample.

Example aspect 26: The apparatus of example aspect 25, wherein the means for distributing current comprises:
means for applying a mirrored current to the sampler of the second stage based on the sample.

Example aspect 27: The apparatus of example aspect 25 or example aspect 26, further comprising:
means for determining an analog residue signal,
wherein the quantizer of the first stage comprises means for iteratively coupling bits of a digital value to the means for determining.

Example aspect 28: A method for operating a pipelined analog-to-digital converter, the method comprising:
sampling an analog signal to obtain an analog voltage on at least one capacitor of a first stage of the pipelined analog-to-digital converter;
comparing the analog voltage to another voltage to produce a comparison signal;
quantizing the analog voltage to produce a digital value for the first stage based on the comparison signal; and
transferring an indication of the analog voltage to a second stage of the pipelined analog-to-digital converter based on the comparison signal at least partially during the quantizing of the analog voltage.

Example aspect 29: The method of example aspect 28, wherein the transferring comprises:
applying a current to at least one capacitor of the second stage to charge the at least one capacitor of the second stage; and
applying the current to the at least one capacitor of the first stage to discharge the at least one capacitor of the first stage.

Example aspect 30: The method of example aspect 28 or example aspect 29, further comprising:
decreasing the analog voltage on the at least one capacitor of the first stage based on the comparison signal, wherein:
the transferring comprises increasing a voltage on at least one capacitor of the second stage;
the quantizing comprises converting time to the digital value; and the method further comprises:
decreasing the voltage on the at least one capacitor of the second stage based on the digital value responsive to generation of each bit of the digital value.

Example aspect 31: The method of any one of example aspects 28-30, wherein the transferring comprises:
applying to at least one capacitor of the second stage a first current having a first magnitude during a first portion of the quantizing; and
applying to the at least one capacitor of the second stage a second current having a second magnitude during a second portion of the quantizing, the second portion occurring after the first portion, the second magnitude being lower than the first magnitude.

Example aspect 32: An apparatus comprising:
a pipelined analog-to-digital converter comprising:
a second stage comprising a sampler; and
a first stage comprising:
a sampler configured to obtain a sample of an analog signal;
a quantizer coupled to the sampler of the first stage and configured to quantize the sample into a digital value; and
a current distribution circuit coupled to the sampler of the first stage and the sampler of the second stage, the current distribution circuit configured to transfer an indication of the sample to the sampler of the second stage at least partially while the quantizer is generating the digital value.

Example aspect 33: An apparatus comprising:
a pipelined analog-to-digital converter comprising:
a first stage comprising:
a sampler configured to obtain a sample of an analog signal;
a time-to-digital converter; and
a comparator comprising an input and an output, the input coupled to the sampler and the output coupled to the time-to-digital converter and the sampler; and
a second stage comprising:
a sampler coupled to the output of the comparator and to the time-to-digital converter.

Example aspect 34: The apparatus of example aspect 33, wherein:
the comparator comprises a zero-crossing amplifier (ZCA).

Example aspect 35: The apparatus of example aspect 33 or example aspect 34, further comprising:
a current mirror coupled between the output of the comparator and the sampler of the first stage and the sampler of the second stage.

Example aspect 36: The apparatus of any one of example aspects 33-35, further comprising:
a digital-to-analog converter (DAC) configured to be shared between the first stage and the second stage, the digital-to-analog converter comprising at least part of the sampler of the second stage and coupled to an output of the time-to-digital converter.

As used herein, the terms "couple," "coupled," or "coupling" refer to a relationship between two or more components that are in operative communication with each other to implement some feature or realize some capability that is described herein. A galvanic coupling can be realized using, for instance, a physical line, such as a metal trace or wire. A galvanic (e.g., physical contact) coupling or an electromagnetic coupling can include a direct coupling or an indirect coupling. A direct coupling refers to connecting circuit elements via a same node without an intervening element. An indirect coupling refers to connecting circuit elements via one or more other devices or other circuit elements, including two or more different nodes.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first stage" or a "first current" in one context may be identified as a "third stage" or a "second current," respectively, in another context.

Similarly, "at least one capacitor" that is part of a given component in one claim may be part of a different component in another claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a pipelined analog-to-digital converter comprising:
  a first stage comprising:
    a sampler;
    a quantizer comprising a time-to-digital converter (TDC), the quantizer coupled to the sampler;
    a current distribution circuit coupled to the sampler; and
    a comparator coupled between the sampler and the quantizer and between the sampler and the current distribution circuit; and
  a second stage comprising:
    a sampler coupled to the current distribution circuit; and
    a quantizer coupled to the sampler of the second stage.

2. The apparatus of claim 1, wherein:
the second stage comprises a comparator;
the comparator of the second stage is coupled between the sampler of the second stage and the quantizer of the second stage; and
the quantizer of the second stage comprises successive approximation register (SAR) logic.

3. The apparatus of claim 2, wherein:
the sampler of the second stage comprises:
  multiple capacitors; and
  multiple switches, each respective switch of the multiple switches coupled in series with a respective capacitor of the multiple capacitors; and
the successive approximation register (SAR) logic is configured to set respective states of respective switches of the multiple switches based on an output of the comparator of the second stage.

4. The apparatus of claim 3, wherein:
each respective capacitor of the multiple capacitors comprises a first plate and a second plate;
each respective switch of the multiple switches is coupled to the second plate of the respective capacitor of the multiple capacitors; and
the current distribution circuit is coupled to the first plate of each respective capacitor of the multiple capacitors.

5. The apparatus of claim 1, further comprising:
at least one switch coupled between an input of the first stage and the sampler of the first stage; and
one or more switches coupled between the current distribution circuit and the sampler of the first stage and the sampler of the second stage.

6. The apparatus of claim 1, wherein the current distribution circuit is configured to:
apply at least one current to the sampler of the first stage and the sampler of the second stage.

7. The apparatus of claim 6, wherein the current distribution circuit is configured to:
discharge the sampler of the first stage and charge the sampler of the second stage by applying the at least one current respectively to the sampler of the first stage and to the sampler of the second stage.

8. The apparatus of claim 7, wherein the current distribution circuit is configured to:
charge the sampler of the second stage at least partially while discharging the sampler of the first stage.

9. The apparatus of claim 6, wherein:
the current distribution circuit comprises at least one current source; and
the at least one current source is configured to apply the at least one current by routing a same current to the sampler of the first stage and the sampler of the second stage.

10. The apparatus of claim 6, wherein:
the current distribution circuit comprises a first current source and a second current source, the first and second current sources arranged into a current mirror;
the current mirror is configured to provide a first current and a second current; and
the current mirror is configured to apply the at least one current by routing the first current to the sampler of the first stage and the second current to the sampler of the second stage.

11. The apparatus of claim 6, wherein:
the current distribution circuit comprises a first current source and a second current source;
the first current source is configured to provide a first current;
the second current source is configured to provide a second current, the second current having a lower magnitude than the first current; and
the current distribution circuit is configured to apply the at least one current by applying the first current before the second current.

12. The apparatus of claim 1, wherein:
the comparator is configured to control application of at least one current by the current distribution circuit.

13. The apparatus of claim 12, wherein:
the quantizer is configured to determine a digital value based on an output of the comparator.

14. The apparatus of claim 13, wherein the current distribution circuit is configured to:
provide, using the at least one current, analog information to the sampler of the second stage at least partially while the quantizer of the first stage is determining the digital value, the analog information related to an analog signal sampled by the sampler of the first stage.

15. The apparatus of claim 13, wherein:
the time-to-digital converter (TDC) is configured to convert a time period that is indicated by the comparator to the digital value.

16. The apparatus of claim 1, wherein the pipelined analog-to-digital converter comprises:
a residue determiner coupled to the current distribution circuit and the quantizer of the first stage, wherein:
the current distribution circuit is configured to apply at least one current to the residue determiner; and
the quantizer of the first stage is configured to:
generate a digital value; and
provide the digital value to the residue determiner.

17. The apparatus of claim 16, wherein:
the quantizer of the first stage is configured to couple bits of the digital value to the residue determiner as the bits of the digital value are being generated.

18. The apparatus of claim 1, wherein the pipelined analog-to-digital converter comprises:
a third stage comprising:
a sampler;
a quantizer coupled to the sampler of the third stage; and
a current distribution circuit coupled to the sampler of the third stage and the sampler of the first stage,
wherein the current distribution circuit of the third stage is configured to apply at least one current to the sampler of the third stage and the sampler of the first stage.

19. The apparatus of claim 18, wherein:
the current distribution circuit of the third stage is configured to provide, using the at least one current, first analog information to the sampler of the first stage at least partially while the quantizer of the third stage is determining a first digital value, the first analog information related to an analog signal sampled by the sampler of the third stage; and
the current distribution circuit of the first stage is configured to provide, using at least one other current, second analog information to the sampler of the second stage at least partially while the quantizer of the first stage is determining a second digital value, the second analog information related to the first analog information provided to the sampler of the first stage by the current distribution circuit of the third stage.

20. The apparatus of claim 1, further comprising:
a wireless interface device,
wherein the wireless interface device comprises the pipelined analog-to-digital converter.

21. The apparatus of claim 20, further comprising:
a display screen; and
at least one processor operatively coupled to the display screen and at least a portion of the wireless interface device, the at least one processor configured to present one or more graphical images on the display screen based on one or more wireless signals received using the pipelined analog-to-digital converter of the wireless interface device.

22. An apparatus for pipelined analog-to-digital conversion, the apparatus comprising:
a first stage comprising:
a sampler configured to obtain a sample of an analog signal; and
a quantizer coupled to the sampler;
a second stage comprising:
a sampler; and
a quantizer coupled to the sampler of the second stage; and means for distributing at least one current to the sampler of the first stage and the sampler of the second stage based on the sample to discharge the sampler of the first stage and charge the sampler of the second stage.

23. The apparatus of claim 22, wherein the means for distributing at least one current comprises:
means for applying a mirrored current to the sampler of the second stage based on the sample.

24. The apparatus of claim 22, further comprising:
means for determining an analog residue signal,
wherein the quantizer of the first stage comprises means for iteratively coupling bits of a digital value to the means for determining.

25. A method for operating a pipelined analog-to-digital converter, the method comprising:
sampling an analog signal to obtain an analog voltage on at least one capacitor of a first stage of the pipelined analog-to-digital converter;
comparing the analog voltage to another voltage to produce a comparison signal;
quantizing the analog voltage to produce a digital value for the first stage based on the comparison signal; and
transferring an indication of the analog voltage to a second stage of the pipelined analog-to-digital converter based on the comparison signal at least partially during the quantizing of the analog voltage.

26. The method of claim 25, further comprising:
decreasing the analog voltage on the at least one capacitor of the first stage based on the comparison signal, wherein:
the transferring comprises increasing a voltage on at least one capacitor of the second stage;
the quantizing comprises converting time to the digital value; and
the method further comprises:
decreasing the voltage on the at least one capacitor of the second stage based on the digital value responsive to generation of each bit of the digital value.

27. An apparatus comprising:
a pipelined analog-to-digital converter comprising:
a first stage comprising:
a sampler configured to obtain a sample of an analog signal;
a time-to-digital converter; and
a comparator comprising an input and an output, the input coupled to the sampler and the output coupled to the time-to-digital converter and the sampler; and
a second stage comprising:
a sampler coupled to the output of the comparator and to the time-to-digital converter.

28. The apparatus of claim 27, wherein:
the comparator comprises a zero-crossing amplifier (ZCA).

29. The apparatus of claim 27, further comprising:
a current mirror coupled between the output of the comparator and the sampler of the first stage and the sampler of the second stage.

30. An apparatus comprising:
a pipelined analog-to-digital converter comprising:
a first stage comprising:
a sampler;
a quantizer coupled to the sampler; and
a current distribution circuit coupled to the sampler;
a comparator coupled between the sampler of the first stage and the current distribution circuit, the comparator configured to control application of at least one current by the current distribution circuit and a second stage comprising:
a sampler coupled to the current distribution circuit; and
a quantizer coupled to the sampler of the second stage; and
a wireless interface device comprising the pipelined analog-to-digital converter.

\* \* \* \* \*